(12) United States Patent
Okada et al.

(10) Patent No.: US 7,875,316 B2
(45) Date of Patent: Jan. 25, 2011

(54) SURFACE-COATED CUTTING INSERT AND METHOD FOR MANUFACTURING THE SAME

(75) Inventors: Yoshikazu Okada, Toride (JP); Takushi Saeki, Kashiwa (JP); Hiroshi Ohmori, Shimotsuma (JP)

(73) Assignee: Mitsubishi Materials Corporation, Tokyo (JP)

( * ) Notice: Subject to any disclaimer, the term of this patent is extended or adjusted under 35 U.S.C. 154(b) by 0 days.

(21) Appl. No.: 12/717,498

(22) Filed: Mar. 4, 2010

(65) Prior Publication Data

US 2010/0154596 A1    Jun. 24, 2010

Related U.S. Application Data

(62) Division of application No. 11/565,080, filed on Nov. 30, 2006.

(30) Foreign Application Priority Data

Dec. 2, 2005    (JP) .............................. 2005-349652

(51) Int. Cl.
    *C23C 28/04* (2006.01)
(52) U.S. Cl. ................. 427/348; 427/419.1; 427/419.2; 427/419.7
(58) Field of Classification Search ................... 51/307, 51/309; 428/141, 156, 698, 701; 427/348, 427/419.1, 419.2, 419.7
    See application file for complete search history.

(56) References Cited

U.S. PATENT DOCUMENTS

| 5,861,210 | A | 1/1999 | Lenander et al. |
| 6,682,274 | B2 | 1/2004 | Votsch et al. |
| 7,090,914 | B2 | 8/2006 | Yamagata et al. |
| 7,153,562 | B2 | 12/2006 | Rodmar et al. |
| 7,207,750 | B2 | 4/2007 | Annanolli et al. |
| 7,393,263 | B2 | 7/2008 | Okada et al. |
| 2002/0039521 | A1 | 4/2002 | Votsch et al. |
| 2006/0194078 | A1 | 8/2006 | Heinrich et al. |

FOREIGN PATENT DOCUMENTS

| DE | 10332101 | 2/2005 |
| EP | 0693574 | 1/1996 |
| EP | 1455003 | 9/2004 |
| EP | 1806192 | 7/2007 |
| EP | 1842609 | 10/2007 |
| JP | 05-057507 A | 3/1993 |
| JP | 08-052603 A | 2/1996 |
| JP | 2002-144108 A | 5/2002 |
| JP | 2003-094230 A | 4/2003 |

*Primary Examiner*—Archene Turner
(74) *Attorney, Agent, or Firm*—Leason Ellis LLP.

(57) ABSTRACT

A method for manufacturing a surface-coated cutting insert that includes an insert body having a substrate of tungsten carbide-based cemented carbide, titanium carbonitride-based cermet or ceramics, a base layer, an intermediate layer and an outermost layer. The base layer and the outermost layer are made of a single layer or two or more layers formed of carbides, nitrides, oxides, or borides of one selected from the group consisting of Group IVa metals, Group Va metals, Group VIa metals, aluminum and silicon, or complex compounds thereof, and the intermediate layer is formed of primarily $Al_2O_3$. The outermost layer is removed on part of the insert body surface including the flank face and a flank face-side cutting edge portion of the intersecting edge line region, with the outermost layer being left on part of the rake face inside a boundary with the intersecting edge line region.

10 Claims, 15 Drawing Sheets

(a) (b)

(a) (b)

(a)　　　(b)

(a)　　　(b)

SURFACE-COATED CUTTING INSERT AND METHOD FOR MANUFACTURING THE SAME

CROSS REFERENCE TO RELATED APPLICATIONS

This is a Divisional Application of U.S. application Ser. No. 11/565,080 filed Nov. 30, 2006, which claims priority under U.S.C. §119 to Japanese Patent Application No. 2005-349652, filed Dec. 2, 2005, each of which is incorporated by reference herein in its entirety.

BACKGROUND OF THE INVENTION

1. Field of the Invention

The present invention relates to surface-coated cutting inserts which can be attached to various types of insert-removable machine tools and used for cutting. The present invention additionally relates to a method for manufacturing such inserts.

The present invention claims priority from Japanese Patent Application No. 2005-349652, filed on Dec. 2, 2005, the content of which is incorporated herein by reference.

2. Background Art

Cutting inserts have an insert body of, for example, a polygonal shape composed of a hard material substrate such as tungsten carbide-based cemented carbide, titanium carbonitride-based cermet or ceramics, with cutting edges formed in an intersecting edge line region where rake faces and flank faces intersect. Such cutting inserts are attached to insert-removable machine tools and widely used for cutting metallic materials. In addition, surface-coated cutting inserts have also been proposed to date, primarily to enhance wear resistance. Such cutting inserts are obtained by coating a cutting insert with, in order from the insert body side, a base layer formed of a single layer or a plurality of two or more layers composed of a carbide, nitride, oxide or boride of a periodic table Group IVa metal, Group Va metal, Group VIa metal, aluminum or silicon, or a complex compound thereof, on the surface of the insert body; an intermediate layer including primarily $Al_2O_3$; and an outermost layer which, as with the base layer, is formed of a single layer or a plurality of two or more layers composed of a carbide, nitride, oxide or boride of a periodic table Group IVa metal, Group Va metal, Group VIa metal, aluminum or silicon, or a complex compound thereof.

Patent Documents 1 and 2, for example, describe such surface-coated cutting inserts in which portions of these layers have been mechanically removed. Patent Document 1 specifically describes a cutting insert having an $\alpha$-$Al_2O_3$ layer (intermediate layer) from which a $TiC_xN_yO_z$ layer (outermost layer) is mechanically removed only from the cutting edge lines or from both the rake faces and the cutting edge lines, but is left in place on the flank faces. By thus having $Al_2O_3$, with its strong resistance to diffusion-type crater wear and smearing, serve as the outermost layer on the rake faces and the cutting edges, and by having $TiC_xN_yO_z$, with its strong resistance to flank wear, serve as the outermost layer on the flank faces instead of $Al_2O_3$ which wears relatively fast on the flank face, an excellent wear resistance is achieved at the same time on both the rake faces and the flank faces. This prior art also discloses that the $TiC_xN_yO_z$ layer on the flank faces facilitates "used cutting edge identification" for distinguishing between used cutting edges and unused cutting edges. Illustrative methods for mechanical layer removal include brushing, polishing and blasting.

Patent Document 2 provides a wear-indicating layer on the flank faces for easy detection of whether a cutting edge is used or unused. Also disclosed is a more preferred method in which an $Al_2O_3$ layer is applied as a wear-reducing coating and a TiN layer is subsequently applied as an outermost layer, after which the TiN layer, which is intended to serve as a wear-indicating layer, is mechanically removed by brushing or sandblasting from the rake faces.

However, in such cutting technology, there has been a desire in recent years for ever higher precision machining. To this end, in addition to the concern that has obviously existed to date regarding the dimensional precision of machining, much importance is now being placed on enhancing the quality of the machined surface (finished surface) of the workpiece.

Here, as noted above, because prior-art cutting inserts have been provided with an excellent wear resistance at both the rake faces and the flank faces, a certain degree of improvement has been achieved with regard to cutting precision.

However, because the criteria for judging the quality of the machined surface have become more exacting in recent years, at the initial stage of cutting or at a stage relatively soon after the start of cutting, the cutting edge quickly reaches a condition where the desired quality cannot be achieved. Even though little wear has yet occurred, the tool operator decides at this point that the cutting edge has reached the end of its useful life, and either changes the cutting edge in use or changes the insert itself. Here, the operator determines that the cutting edge has reached the end of its useful life when the machined surface of the workpiece incurs scuffing and fluffing, becoming perceptibly rough to the touch, or the surface appears dull and without luster. In particular, with the trend recently toward more difficult-to-machine materials, such abnormal surface conditions are increasingly likely to occur.

Also, in the above-described prior-art cutting inserts, although "used cutting edge identification" for distinguishing between used cutting edges and unused cutting edges is carried out based on the $TiC_xN_yO_z$ layer or the TiN layer serving as a wear-indicating layer on the flank face sides, it is difficult to reliably determine whether a cutting edge is used or unused under, for example, poor lighting conditions in the operational sites of cutting work. In particular, the above-described surface-coated cutting inserts of Patent Document 2 rely on the fact that, due to discoloration under the action of heat generated during cutting, the flank face zone which does not come into direct contact with the workpiece during use but is adjacent to the cutting edge that has been used also discolors. Accordingly, the region that discolors is smaller than the rake face which comes into direct contact with the chip and generates much heat, and the degree of discoloration is also weak, making it even more difficult to identify whether a cutting edge has been used or is unused.

It is therefore an object of the present invention to provide surface-coated cutting inserts which are capable of forming high-quality machined surfaces that have a good luster and do not cause scuffing or fluffing on the surface of the work material, and which enable a reliable determination to be made as to whether a cutting edge has been used or is unused. Another object of the invention is to provide a method for manufacturing such cutting inserts.

(Patent Document 1) Japanese Patent Application, First Publication No. H8-52603

(Patent Document 2) Japanese Patent Application, First Publication No. 2002-144108

SUMMARY OF THE INVENTION

The surface-coated cutting insert of the present invention includes: an insert body having a substrate of tungsten carbide-based cemented carbide, titanium carbonitride-based cermet or ceramics; and a base layer, an intermediate layer and an outermost layer which are provided on a surface of the insert body, in order from the insert body side; wherein a cutting edge is formed at an intersecting edge line region where a rake face and a flank face of the insert body intersect, the base layer and the outermost layer are made of a single layer or two or more layers formed of carbides, nitrides, oxides, or borides of one selected from the group consisting of periodic table Group IVa metals, Group Va metals, Group VIa metals, aluminum and silicon, or complex compounds thereof, and the intermediate layer is formed of primarily $Al_2O_3$, the outermost layer is removed so as to leave primarily the intermediate layer exposed on part of the insert body surface, including at least the flank face and a flank face-side cutting edge portion of the intersecting edge line region that is connected to the flank face, with the outermost layer being left on at least part of the rake face inside a boundary with the intersecting edge line region.

The outermost layer may be removed so as to leave primarily the intermediate layer exposed on the flank face and all of the intersecting edge line region.

The outermost layer may be removed so as to leave primarily the intermediate layer exposed from the flank face to a range inside the rake face from the boundary between the intersecting edge line region and the rake face.

The outermost layer may be removed so as to leave primarily the intermediate layer exposed within a range up to 2 mm inside the rake face from the boundary between the intersecting edge line region and the rake face.

The intermediate layer primarily left exposed on the flank face may have a surface roughness, expressed as the arithmetical mean roughness Ra at a cutoff value of 0.08 mm, of 0.3 μm or less.

The base layer or the outermost layer or both thereof may have a single layer or two or more layers formed of carbides, nitrides, oxides, or borides of one selected from the group consisting of Ti, Zr, Hf, and Cr, which are selected from periodic table Group IVa metals, Group Va metals, and Group VIa metals, and aluminum and silicon, or complex compounds thereof.

The intermediate layer may be a layer which includes $Al_2O_3$ at a content of 80 vol % or more.

At the flank face and at the flank face-side cutting edge portion, the intermediate layer may be exposed 70% or more of the surface area.

The outermost layer may be removed by wet blasting.

The method for manufacturing a surface-coated cutting insert of the present invention includes: forming a cutting edge at an intersecting edge line region where a rake face and a flank face intersect on an insert body having a substrate of tungsten carbide-based cemented carbide, titanium carbonitride-based cermet or ceramics; coating a surface of the insert body with, in order from the insert body side, a base layer, an intermediate layer and an outermost layer such that the base layer and the outermost layer are formed of carbides, nitrides, oxides, or borides of one selected from the group consisting of periodic table Group IVa metals, Group Va metals, Group VIa metals, aluminum and silicon, or complex compounds thereof, and the intermediate layer is formed of primarily $Al_2O_3$; and then removing the outermost layer so as to leave primarily the intermediate layer exposed on part of the surface of the insert body, including at least the flank face and at least a flank face-side cutting edge portion of the intersecting edge line region that is connected to the flank face, but excluding at least part of the rake face inside a boundary with the intersecting edge line region.

The outermost layer may be removed so as to leave primarily the intermediate layer exposed on the flank face and all of the intersecting edge line region.

The outermost layer may be removed so as to leave primarily the intermediate layer exposed from the flank face to a range inside the rake face from the boundary between the intersecting edge line region and the rake face.

The outermost layer may be removed so as to leave primarily the intermediate layer exposed within a range up to 2 mm inside the rake face from the boundary between the intersecting edge line region and the rake face.

The intermediate layer primarily left exposed on the flank face may be made to have a surface roughness, expressed as the arithmetical mean roughness Ra at a cutoff value of 0.08 mm, of 0.3 μm or less.

The intermediate layer may be made to be a layer which includes $Al_2O_3$ at a content of 80 vol % or more.

At the flank face and at the flank face-side cutting edge portion, the intermediate layer may be made to be exposed 70% or more of the surface area.

The outermost layer may be removed by wet blasting.

The method may further include clamping and holding the insert body, on a side thereof on which the rake face is formed and an opposite side thereto, with a pair of rotating shafts that are rotatable around an axis, and carrying out wet blasting by jetting an abrasive fluid against the surface of the insert body with a blasting gun while rotating the insert body.

The method may further include carrying out wet blasting by jetting an abrasive fluid against the surface of the insert body with a blasting gun at a jetting angle of 10 to 90° to the axis of the rotating shafts.

The method may further include carrying out wet blasting by jetting an abrasive fluid against the surface of the insert body with a blasting gun at a jetting angle of 30 to 90° to the axis of the rotating shafts.

The method may further include attaching masking members to at least one of the pair of rotating shafts which clamp therebetween the insert body, and carrying out wet blasting while masking the part of the rake face.

Referring to FIG. 21, which is an enlarged cross-sectional view of the vicinity of the cutting edge 1 on a common negative-type cutting insert, an insert body 2 has a rake face 3, a flank face 4, and an intersecting edge line region 5 where the cutting edge 1 is to be formed at which the rake face 3 and the flank face 4 intersect. In FIG. 21, round honing has been administered. Even in a cutting insert where such honing has not been carried out and the rake face 3 and the flank face 4 have been formed so as to intersect at an angle, the intersecting edge line region 5 is never actually a line with no width, but rather is in a state that has been honed to a given, albeit very small, width. That is, viewed microscopically, the cutting insert is rendered into a state like that shown in FIG. 21. In addition, as shown in the diagram, a recessed groove-like chipbreaker 6 may be formed on the rake face 3.

When a workpiece W is cut with such a cutting insert, as shown in FIG. 22, at the start of cutting, of the intersecting edge line region 5 where the cutting edge 1 is formed, as indicated by the black arrow in FIG. 22, the region of a flank face-side cutting edge portion 5a connected to the flank face ultimately contacts a machined surface P of the workpiece W, forming this machined surface P. With progressive wear of the cutting edge 1, as shown in FIG. 23, the region of the flank face 4 that comes into contact with the machined surface P widens, as a result of which the flank face 4 region eventually forms a machined surface P like that indicated by the black arrow in FIG. 23. In FIGS. 22 and 23, the white arrows indicate the direction of advance by the cutting insert relative to the workpiece W. Also shown is the chip C cut from the workpiece W.

It thus occurred to the inventors that, in order to obtain a high-quality machined surface P, the properties of both the flank face 4 and a flank face-side cutting edge portion 5a of the intersecting edge line region 5 connected to the flank face 4 which ultimately come into contact with the machined surface P are important. In particular, because most of surface-coated cutting inserts are used for high-load rough and semi-finish cutting although they are also used for finish cutting and generally are used until the width of wear on the flank face 4 grows to 0.3 mm or more, the properties of the flank face 4 appear to be very important. In addition, the inventors have learned that, at the flank face 4 and the flank face-side cutting edge portion 5a which thus come into contact with the machined surface P and ultimately form the machined surface P, by exposing primarily an intermediate layer made chiefly of $Al_2O_3$, which has a low coefficient of friction, rather than a $TiC_xN_yO_z$ layer or a TiN layer as on the flank faces of conventional surface-coated cutting inserts, scuffing and fluffing due to rubbing against the machined surface P can be suppressed even at a higher wear rate. This discovery ultimately led to the surface-coated cutting inserts of the present invention.

Therefore, using such a surface-coated cutting insert according to the present invention, compared with prior-art inserts having a $TiC_xN_yO_z$ layer or a TiN layer on the surface of the flank face, a high-quality machined surface P having luster can be obtained over a long period of time, even when the work material is difficult to machine. In other words, the time until the operator decides that the cutting edge has reached the end of its useful life and either changes the cutting edge or changes the insert itself can be extended. At the same time, it is possible to leave an outermost layer formed of one or more layer, each of which is made of carbides, nitrides, oxides, or borides of one selected from the group consisting of periodic table Group IVa metals, Group Va metals, Group VIa metals, aluminum and silicon, or complex compounds thereof, on at least part of that portion of the rake face which is inside of the boundary with the intersecting edge line region, and to adjust this outermost layer so that it exhibits a bright color that is, for example, yellow or of a whitish hue, in contrast with the intermediate layer including primarily the blackish $Al_2O_3$. This makes it possible to readily notice a change in color due to frictional heat generated by rubbing of the chip against the insert during cutting; thereby, enabling the reliable determination of whether a cutting edge is used or unused.

Here, the intermediate layer exposed with the removal of the outermost layer need not be 100% $Al_2O_3$, and may be made substantially of $Al_2O_3$ as the primary component. The above-indicated effects can be obtained so long as the intermediate layer has an $Al_2O_3$ content of preferably 80 vol % or more. For example, the intermediate layer may be a compound layer made of a solid solution of $Al_2O_3$ with a substance selected from among the carbides, nitrides, oxides and borides of titanium, zirconium, hafnium, chromium and silicon, and complex compounds thereof, a mixture layer obtained by precipitating these substances in a matrix of $Al_2O_3$, or a multilayer structure obtained by alternately laminating layers of $Al_2O_3$ with layers of these substances a plurality of times. Moreover, the $Al_2O_3$ itself may have any of a number of crystalline structures, such as an α or a κ structure. The above-described effects are achievable regardless of the crystalline structure; however, a higher quality machined surface can be obtained particularly with α-$Al_2O_3$.

At the flank face and at the flank face-side cutting edge portion of the intersecting edge line region which is a connected to the flank face, it is not essential for the outermost layer to be completely removed so as to leave only the intermediate layer exposed. For example, it is acceptable for a little of the outermost layer to remain, so long as it is primarily the intermediate layer that is exposed. However, if the ratio of intermediate layer exposure is too small, the above effects may not be fully achieved. Hence, it is desirable that, at the flank face and at the flank face-side cutting edge portion of the intersecting edge line region which is connected to the flank face, the intermediate layer be exposed 70% or more of the surface area. The coating thickness of the intermediate layer exposed in this way by removal of the outermost layer is preferably set in a range of from 1 to 15 μm. At less than 1 μm, the intermediate layer soon wears down, which may make it impossible to continue forming a high-quality machined surface over an extended period of time. On the other hand, as the thickness increases above 15 μm, it may become increasingly that a remarkable decline in the toughness will occur, leading to flaking or chipping of the intermediate layer.

The areas where primarily the intermediate layer is exposed in this way by removing the outermost layer are at least the flank face and the flank face-side cutting edge portion of the intersecting edge line region which is connected to the flank face; that is, it suffices for these areas to be the flank face and at least a portion on the side of the intersecting edge line region which connects to the flank face. However, so long as the outermost layer for identifying whether a cutting edge is used or unused is retained to a sufficient degree in the region on the surface of the insert where rubbing between the insert and the chip occurs, the outermost layer may be removed from the flank face and all of the intersecting edge line region so as to leave primarily the intermediate layer exposed. Moreover, the outermost layer may be removed from the flank face to a range inside the rake face from the boundary between the intersecting edge line region and the rake face so as to leave primarily the intermediate layer exposed. In this case, because the intermediate layer including primarily $Al_2O_3$ is exposed at the intersecting edge line region where the cutting edge is formed and at the cutting edge side of the rake face, as noted also in Patent Document 1, the resistance to diffusion-type crater wear or smearing is enhanced; thereby, enabling the period until the cutting edge is changed to be effectively extended.

However, when the outermost layer is removed in this way to the inside of the rake face, excessive removal of the outermost layer to the inside of the rake face may result in a loss in the ability to determine whether the cutting edge is used or unused. Hence, it is desirable for primarily the intermediate layer to be exposed by removal of the outermost layer in a range from the flank face to 2 mm inside the rake face from the boundary between the intersecting edge line region and the rake face. Of course, these are the portions of the insert body which take part in cutting, particularly the corner sides of the cutting edge. In the portions connected to the intersecting edge line region of the insert body which do not take part in cutting, and which therefore also do not play a role in determining whether the cutting edge is used or unused, the outermost layer may remain intact or may be partially or completely removed so that the intermediate layer is in an exposed state.

Moreover, as described subsequently, when primarily the intermediate layer is to be left exposed on at least the flank face and the flank face-side cutting edge portion of the intersecting edge line region that is connected to the flank face, in addition to removing the outermost layer, the surface roughness in the areas of such removal may be improved so as to further enhance the quality of the machined surface. In the case of surface-coated cutting inserts in particular, so-called M-grade accuracy cutting inserts in which the flank face portion of an insert body having a substrate of tungsten carbide-based cemented carbide, titanium carbonitride-based cermet or ceramics is subjected to coating, without grinding, directly on the as-sintered surface are widely used. However, even in such cases, by improving the surface roughness as described above, it is possible to reduce friction with the workpiece and thereby obtain a better-quality machined surface having a higher luster.

The thus-improved surface roughness of the intermediate layer which is primarily exposed at the flank face has an arithmetical mean roughness Ra at a cutoff value of 0.08 mm, as described in JIS B0601-1994 (2001), of preferably 0.3 μm or less, and more preferably 0.2 μm or less. At a small surface roughness such as this, along with the fact that the intermediate layer exposed at the flank face includes primarily $Al_2O_3$, which has a low friction coefficient, as noted above, a high-quality cutting surface can be obtained. The cutoff value is set to 0.08 mm here because the microscopic state of the intermediate layer surface influences of the quality of the machined surface. This particular cutoff value is adopted to eliminate waviness (the wavy component) at the sintered surface owing to the density difference of the green compact prior to sintering of the insert body and to such effects as sintering deformation that arise during sintering.

When the base layer or the outermost layer or both thereof includes a substance selected from the group consisting of carbides, nitrides, oxides and borides of periodic table Group IVa metals, Group Va metals, Group VIa metals, aluminum and silicon, and complex compounds thereof, it is desirable for the periodic table Group IVa metals, Group Va metals, Group VIa metals to be selected from among titanium, zirconium, hafnium and chromium. That is, from the standpoint of surface coating treatment technology for the mass production of surface-coated cutting inserts, compounds of these metals are excellent substances both because of their cutting performance and the cost-effectiveness of coating treatment. As a result, surface-coated cutting inserts with better cutting properties can be provided while holding down production costs.

On the other hand, in order to manufacture a surface-coated cutting insert in which primarily the intermediate layer is exposed on, of the surface of the insert body, at least the flank face and the flank face-side cutting edge portion of the intersecting edge line region that is a connected to the flank face, and the outermost layer is left on at least a portion of the rake face inside of the boundary with the intersecting edge line region, it is also conceivable to, for example, coat the surface of the insert body with a base layer and an intermediate layer, then temporarily take out the insert body from the coating furnace, apply masking to the portion where the intermediate layer is to be exposed, then once again set the insert body in the coating furnace and coat it with the outermost layer. Although it would be possible to use such a method to manufacture the surface-coated cutting insert of the present invention, a method for manufacturing this type has a poor work-ability and is not cost-effectiveness. Moreover, unless the masking is stable, the outermost layer will end up being widely coated even in areas where the intermediate layer should be left exposed, as a result of which the above-described effects may not be achieved.

By contrast, in the method for manufacturing surface-coated cutting inserts of the present invention, as described above, a base layer, intermediate layer and outermost layer are coated onto the surface of the insert body, and then the outermost layer is removed from the surface of the insert body so as to leave primarily the intermediate layer exposed, including at least the flank face and at least a flank face-side cutting edge portion of the intersecting edge line region that is connected to the flank face, but excluding at least part of the rake face inside a boundary with the intersecting edge line region. Therefore, as in prior-art surface-coated cutting inserts, given that each continuous coatings of each layer have been applied, all that needs to be done is to partially remove the outermost layer. In addition to being suitable for mass production, such an approach is also efficient and cost-effective. Moreover, an outermost layer is not coated in subsequent steps onto the regions where primarily the intermediate layer has thus been exposed. Hence, surface-coated cutting inserts which exhibit the outstanding effects described above can be stably and reliably manufactured at a low cost.

In the manufacturing method of the present invention, in order to remove in this way the outermost layer, it is also conceivable to employ a method that involves machining with, for example, an elastic grindstone, a nylon brush containing an abrasive, or a bristle brush that uses diamond paste. However, because these machining techniques have a high working energy that is utilized also for honing and lapping cutting edges on conventional cutting inserts, there is a possibility that grinding scratches and the like may arise on the surface of the intermediate layer exposed with removal of the outermost layer. In particular, it is possible that such machining will degrade the surface roughness of the flank face or lead to a decline in the toughness of the insert itself. Moreover, with the use of such techniques, the working energy acts with particular force on the outwardly projecting intersecting edge line region of the insert body where the cutting edge is formed. Hence, in this intersecting edge line region, treatment may not cease with removal of the outermost layer, and may proceed to the point where even the intermediate layer is locally thinned and ground.

Therefore, in the manufacturing method of the present invention, it is desirable to remove the outermost layer by wet blasting which does not employ such a high working energy and which minimizes localized concentration of the working energy. That is, with such wet blasting, abrasion is carried out by jetting an abrasive fluid composed of a liquid (generally water) which contains a blasting abrasive toward the workpiece. Compared with machining techniques like those mentioned above which use an elastic grindstone or a brush, or even with dry blasting, this is a soft process having a relatively moderated working energy because the liquid in a space between the abrasive and the workpiece attenuates the kinetic energy of the blasting abrasive. Hence, the use of wet blasting so as to remove an outermost layer like that in the present invention makes it possible to minimize the formation of grinding scratches on the surface of the intermediate layer that is left exposed, enabling a smooth flank face having a surface roughness, expressed as the arithmetical mean roughness Ra described above, of 0.3 μm or less to be obtained. Moreover, because there is no strong localized action by the working energy even at the above-described intersecting edge line region, over-treatment of only the intersecting edge line region where the cutting edge forms does not occur.

Also, even when wet blasting is used in this way to remove the outermost layer from the surface of the insert body, including at least the flank face and a flank face-side cutting edge portion of the intersecting edge line region that is connected to the flank face, but excluding at least a portion of the rake face inside a boundary with the intersecting edge line region, the insert body is clamped and held, on a side thereof on which the rake face is formed and an opposite side thereto, by a pair of rotating shafts that are rotatable around an axis, and the insert body is rotated while wet blasting is carried out by jetting an abrasive fluid against the surface of the insert body with a blasting gun at a jetting angle of 10 to 90° to the axis. In this way, blasting treatment can be automated, enabling stable, high-quality, surface-coated cutting inserts to be economically manufactured in a large volume.

When the jetting angle by the blasting gun to the axis of the rotating shafts is 90°, the blasting gun jets the abrasive fluid while substantially opposed to the flank face. By rotating the insert body, the outermost layer can be uniformly removed from the flank face and the flank face-side cutting edge portion of the intersecting edge line region which is connected to the flank face. Moreover, making the jetting angle smaller than 90° results in the rake face side also being jetted as well as the flank face. Hence, by adjusting the jetting site to the rake face, it is possible to remove the outermost layer so as to expose primarily the intermediate layer on all of the intersecting edge line region where the cutting edge is formed and also to a range inside the rake face from the boundary of this intersecting edge line region with the rake face, while leaving the outermost layer on the inside of the rake face. However, the smaller this jetting angle becomes toward the rake face side, the smaller the angle of incidence of the jetting fluid to the flank face becomes, thus weakening the outermost layer removing action. Hence, as noted above, the jetting angle is set to preferably 10° or more, and more preferably 30° or more.

Furthermore, in the case of a positive-type cutting insert in which the flank face has been provided beforehand with a clearance angle, by directing the abrasive fluid at a smaller jetting angle toward the side opposite the rake face, it is possible to reliably remove the outermost layer even on the flank face-side cutting edge portion while approaching the jetting angle to the perpendicular with respect to the flank face and thus achieving efficient treatment.

Also, in order to efficiently remove the outermost layer so as to expose the intermediate layer on at least the flank face and the flank face-side cutting edge portion of the intersecting edge line region while reliably leaving the outermost layer on a part of the rake face inside the boundary with the intersecting edge line region, it is desirable to attach masking members to the rotating shafts which clamp therebetween the faces of the insert body where the rake faces have been formed, and carry out wet blasting while masking that part of the rake face. In this way, a surface-coated cutting insert on which the outermost layer has been removed within a fixed-width range up to 2 mm inside the rake face from the boundary between the intersecting edge line region and the rake face and the outermost layer has been left behind to the inside thereof, and on which the cutting edges are thus readily distinguishable as used or unused, can be easily manufactured without a loss of productivity.

Any of various hard, fine-grained abrasive, such as alumina, zirconia, resin-based abrasive and glass-based abrasive, may be used as the abrasive material in such a wet blasting operation. It is preferable for the particle size to be about 10 to 500 μm, although fine-grained abrasive with a particle size of about 10 to 200 μm are more preferred. When alumina is used as the abrasive, for example, preferred jetting conditions involve preparing an abrasive fluid composed of from 15 to 60 wt % of the abrasive in admixture with a liquid (water), and jetting the fluid at a compressed air pressure supplied to the blasting gun, i.e., a jetting pressure, in a range of 0.05 to 0.3 MPa.

PREFERRED EMBODIMENTS

Figure 1:
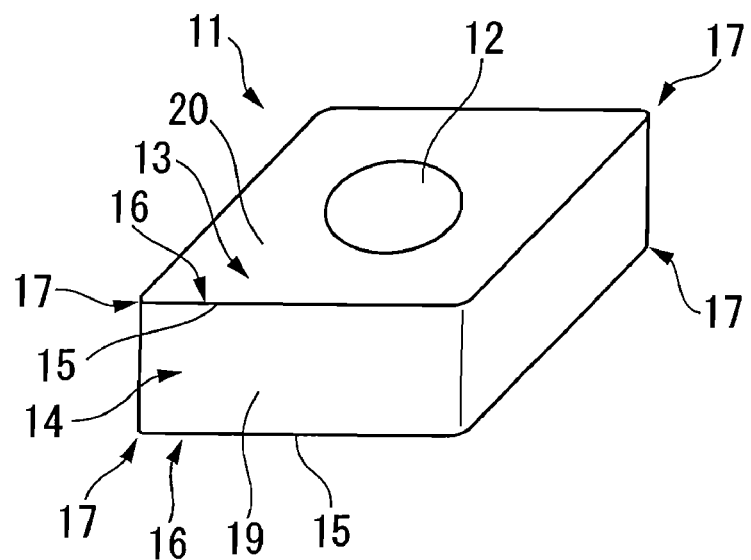
FIG. 1 is a perspective view of an embodiment of the surface-coated cutting insert of the present invention.
Figure 2:
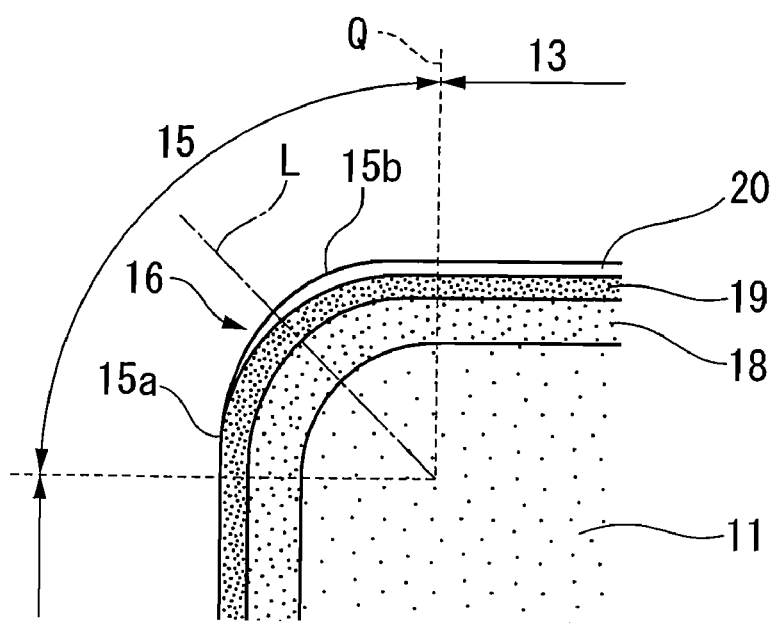
FIG. 2 is an enlarged, cross-sectional view of the embodiment shown in FIG. 1, taken perpendicular to the intersecting edge line region 15 where the cutting edge 16 is formed.

FIGS. 1 and 2 illustrate an embodiment of the surface-coated cutting insert of the present invention. In this embodiment, an insert body 11 is formed in the shape of a polygonal plate (in FIG. 1, a rhombic plate) of sintered material substrate such as tungsten carbide-based cemented carbide, titanium carbonitride-based cermet or ceramics. That is, the surface of the insert body 11 has a pair of polygonal faces that are mutually parallel and a plurality of sidewalls that are disposed at the periphery of these polygonal faces and extend in the depth direction (the vertical direction in FIGS. 1 and 2) of the insert body 11. A mounting hole 12 for attaching the insert body 11 to and detaching it from a mounting seat in an insert-removable machine tool has been formed at the center of the polygonal faces so as to pass through the insert body 11 in the thickness direction.

Rake faces 13 are formed on the polygonal faces of the insert body 11, and flank faces 14 are formed on the sidewalls. Cutting edges 16 are formed in intersecting edge line regions 15 where the rake faces 13 and the flank faces 14 intersect, i.e., at the edges of the polygonal faces. In a cutting insert having an insert body 11 in the shape of a polygonal plate such as that described above, it is rare for all the edges of the polygonal faces to be used as cutting edges 16. Particularly in cutting inserts having a rhombic shape, of the rhombic faces, only the edges on the sides of corners 17 that form acute angles are mainly used as cutting edges 16.

Moreover, the present embodiment is a negative-type insert in which a pair of polygonal faces having rake faces 13 formed therein and four sidewalls having flank faces 14 formed therein extend in directions which mutually intersect perpendicularly at intersecting edges 15. Therefore, cutting edges 16 are formed at the eight edges of the top and bottom polygonal faces between which the corners 17 are located. By rotating the insert body 11 through 180° around the mounting hole 12, it is possible to use, one after another, the cutting edges 16 on the opposite sides (top and bottom sides) of the insert body 11. The intersecting edge line regions 15 where these cutting edges 16 are to be formed are round honed as shown in FIG. 2, and thus exhibit a quarter-circular arcuate shape in cross-section, as shown in FIG. 2.

Referring to FIG. 2, the surface of the insert body 11 is coated with, on the above-mentioned type of substrate, in order from the insert body 11 side: a base layer 18, an intermediate layer 19, and an outermost layer 20. Of these, the base layer 18 and the outermost layer 20 are made of a single layer or a multilayer of two or more layers formed of carbides, nitrides, oxides, or borides of one selected from the group consisting of periodic table Group IVa metals, Group Va metals, Group VIa metals, aluminum and silicon, or complex compounds thereof (excluding a single layer of $Al_2O_3$). The base layer 18 and the outermost layer 20 may be the same or different. However, when at least the base layer 18 or the outermost layer 20 has a layer of carbides, nitrides, oxides, or borides of one selected from the group consisting of periodic table Group IVa metals, Group Va metals, Group VIa metals, aluminum and silicon, or complex compounds thereof, it is preferable for the metals of the periodic table Group IVa, Group Va, and Group VIa to be selected from among titanium, zirconium, hafnium and chromium.

The intermediate layer 19 is formed primarily of $Al_2O_3$. This intermediate layer 19 need not be 100% $Al_2O_3$. That is, it may be a layer which substantially includes $Al_2O_3$ as the primary component, with the content of $Al_2O_3$ preferably being 80 vol % or more. For example, the intermediate layer 19 may be a compound layer formed of a solid solution of $Al_2O_3$ and a substance selected from among carbides, nitrides, oxides and borides of titanium, zirconium, hafnium, chromium and silicon, and complex compounds thereof; a mixture layer composed of these substances precipitated in a matrix of $Al_2O_3$; or a multilayer structure obtained by alternately laminating layers of $Al_2O_3$ with layers of these substances a plurality of times. The $Al_2O_3$ itself may have any of several crystalline structures, such as $\alpha$ or $\kappa$-$Al_2O_3$. Any crystalline structure is acceptable, although $\alpha$-$Al_2O_3$ is especially preferred.

Such a base layer 18, intermediate layer 19 and outermost layer 20 may be formed by a known process such as chemical vapor deposition (CVD) or physical vapor deposition (PVD); however, formation by chemical vapor deposition which involves coating at an elevated temperature and is used in high-load, high-efficiency operation, is especially desirable. The surface of the insert body 11 substrate to be coated may be ground, or may have the M-grade accuracy of the as-sintered state.

In addition, the outermost layer 20 is removed so as to leave primarily the intermediate layer 19 exposed on part of the surface of the insert body 11, including at least the flank face 14 and a flank face-side cutting edge portion 15a of the intersecting edge line region 15 that is connected to the flank face 14, and the outermost layer 20 is left on at least a portion of the rake face 13 inside from a boundary Q between the rake face 13 and the intersecting edge line region 15. That is, the base layer 18 and the intermediate layer 19 have been formed on at least the flank face 14 and a flank face-side cutting edge portion 15a of the intersecting edge line region 15, of the surface of the insert body 11, with primarily the intermediate layer 19 exposed, whereas inside the rake face 13 from the boundary Q, the outermost layer 20 covers the intermediate layer 19 which is continuous from the flank face 14 and the flank face-side cutting edge portion 15a.

In the present embodiment, as shown in FIG. 2, at the flank face 14 and at the flank face-side cutting edge 15a of the intersecting edge line region 15 that is connected to the flank face 14, the outermost layer 20 is removed, leaving the intermediate layer 19 exposed. The outermost layer 20 is left on the rake face 13 and the rake face-side cutting edge portion 15b of the intersecting edge line region 15 other than the flank face-side cutting edge portion 15a. Moreover, in this embodiment, as shown in FIG. 2, the outermost layer 20 extends beyond one-half of the intersecting edge line region 15 which, as noted above, exhibits a quarter-circular arcuate shape in cross-section to the flank face 14 side. That is, at the intersecting edge line region 15, the flank face-side cutting edge portion 15a where the outermost layer 20 has been removed so as to leave the intermediate layer 19 exposed is smaller than one-half of the intersecting edge line region 15, and is also smaller than the rake face-side cutting edge portion 15b where the outermost layer 20 remains.

At the flank face 14 and flank face-side cutting edge portion 15a where the outermost layer 20 has been removed in this way so as to expose the intermediate layer 19, the intermediate layer need not to be completely exposed as the outer layer so long as it is primarily this intermediate layer that is left exposed. For example, it suffices for the intermediate layer 19 to be left exposed at least 70% of the surface area of the flank face 14 and the flank face-side cutting edge portion 15a. Moreover, it is desirable for the coating thickness of the intermediate layer 19 exposed by such removal of the outermost layer 20, i.e., the layer thickness, to be set in a range of from 1 to 15 μm. The layer thickness of the base layer 18 and the outermost layer 20 may be adjusted as appropriate value according to such factors as the compositions thereof. However, taking into account the fact that the outermost layer 20 is removed from the flank face 14 and the flank face-side cutting edge portion 15a, it is desirable for the outermost layer 20 to be applied to a smaller layer thickness than the intermediate layer 19 and the base layer 18.

The flank face 14 and flank face-side cutting edge portion 15a where the outermost layer 20 has thus been removed to expose the intermediate layer 19 will exhibit the blackish color of $Al_2O_3$, which is the primary component of the intermediate layer 19. By contrast, the rake face 13 and the rake face-side cutting edge portion 15b where the outermost layer 20 has been left, notwithstanding some variation due to composition and other factors, will generally exhibit a bright hue having luster, such as a light yellow, cream or gold color. Moreover, the intermediate layer 19 exposed on at least the flank face 14 will have a surface roughness, expressed as the arithmetical mean roughness Ra defined in JIS B 0601-1994 (or JIS B 0601-2001) at an offset value of 0.08 mm, of 0.3 μm or less.

Figure 3:
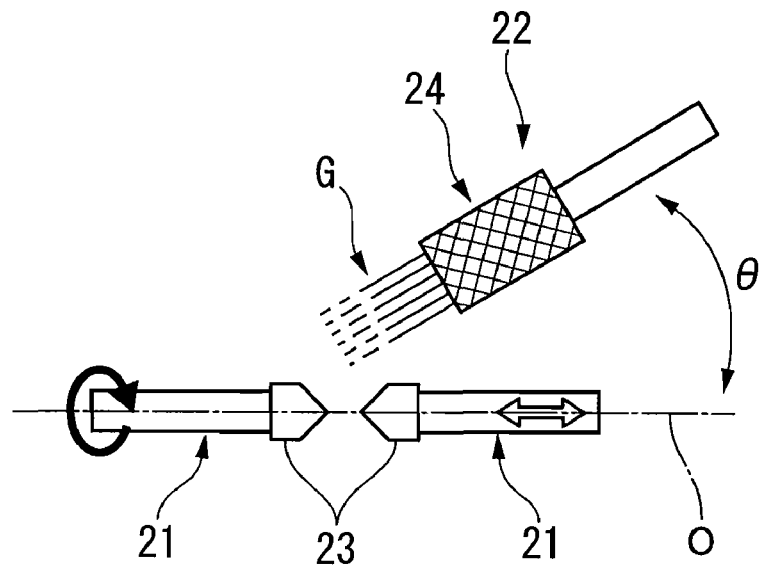
FIG. 3 is a diagram showing a manufacturing apparatus according to an embodiment of the method for manufacturing surface-coated cutting inserts of the present invention.
Figure 4:
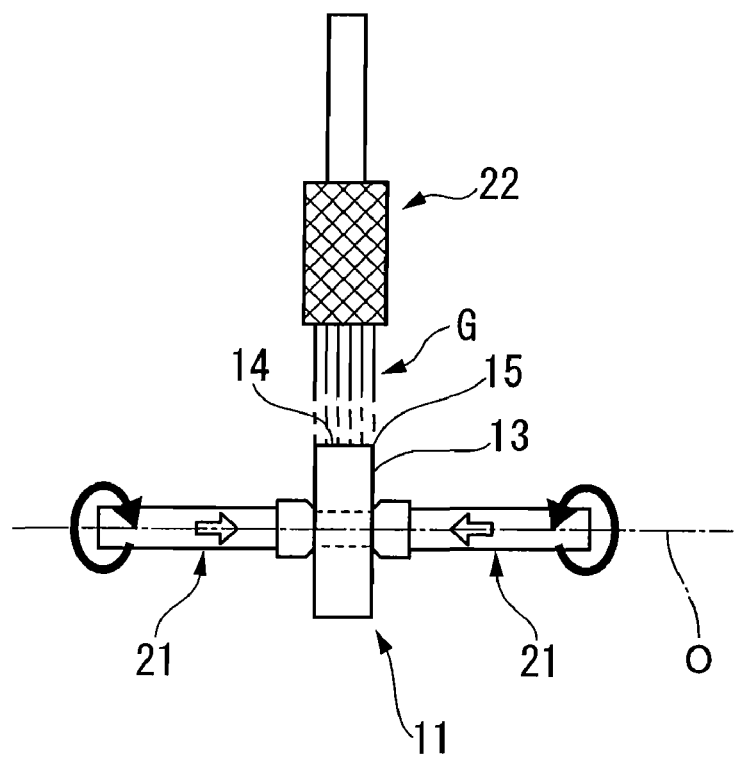
FIG. 4 is a diagram illustrating an embodiment of the manufacturing method of the present invention when the surface-coated cutting insert of the embodiment shown in FIGS. 1 and 2 is manufactured using the apparatus shown in FIG. 3.

Next, FIG. 3 shows an example of an apparatus for manufacturing surface-coated cutting inserts according to the present invention where, in manufacturing surface-coated cutting inserts according to the foregoing embodiment, for example, the outermost layer 20 is removed so as to leave primarily the intermediate layer 19 exposed on, of the surface of the insert body 11, at least the flank face 14 and at least a flank face-side cutting edge portion 15a of the intersecting edge line region 15 that is connected to the flank face 14, but excluding at least a portion of the rake face 13 inside a boundary Q with the intersecting edge line region 15. FIG. 4 illustrates an embodiment of the method of manufacturing a surface-coated cutting insert of the present invention using such a manufacturing apparatus.

In the manufacturing apparatus shown in FIG. 3, a pair of rotating shafts 21 are coaxially supported, with the respective front ends thereof being mutually opposed across an interval therebetween, so as to be rotatable in mutually the same direction around, for example, an axis O which extends in a horizontal direction. In addition, a blasting gun 22 is provided lateral to the axis O (on the top side in FIG. 3) so as to remove the outermost layer 20 by carrying out wet blasting in which an abrasive fluid G is jetted onto the surface of the insert body 11 held between these rotating shafts 21.

Here, the manufacturing apparatus is for an insert body 11 having a mounting hole 12 as described above. A cap 23 which tapers in the form of a cone, for example, toward the front end side and is made of an elastic material such as hard urethane rubber, has attached to the front end of each of the rotating shafts 21. At least one of this pair of rotating shafts 21 is made capable of advancing and retreating in the direction of the axis O. By positioning the insert body 11 between both rotating shafts 21 so that the thickness direction of the insert body 11 is aligned with the direction of the axis O and advancing at least one of the rotating shafts 21 toward the other, the caps 23 each come into close contact with the opening of the mounting hole 12, thus holding the insert body 11 and enabling it to be rotated together with the rotating shafts 21. Accordingly, the insert body 11 held in this way is arranged so that the rake faces 13 thereof are oriented perpendicular to the axis O and face in the direction of the axis O, and so that the flank faces 14 are oriented parallel to the axis O.

The blasting gun 22 carries out wet blasting by using the pressure of compressed air to jet an abrasive fluid G, prepared by mixing a blasting abrasive with a liquid, from a nozzle 24 at the front end thereof toward the insert body 11 clamped between the rotating shafts 21. Water is generally used as the liquid for the abrasive fluid G. Any of various hard abrasive, such as alumina, zirconia, resin-based abrasive and glass-based abrasive, may be used as the abrasive material. The particle size is typically in a range of about 10 to about 500 μm, although a fine-grained abrasive having a particle size of about 10 to about 200 μm is preferred. When alumina, for example, is used as the abrasive, the content of abrasive in the abrasive fluid G is preferably from 15 to 60 wt %, and the pressure of the compressed air (jetting pressure) is preferably in a range of 0.05 to 0.3 MPa.

In addition, the blasting gun 22 is made capable of adjusting the jetting angle θ of the abrasive fluid G with respect to the axis O, that is, the angle between the direction in which the abrasive fluid G is jetted from the nozzle and the axis O, within a range of 10 to 90°. Therefore, the jetting angle θ from the rake face 13 side with respect to the insert body 11 having, as noted above, the rake face oriented in the direction of the axis O, is set to from 10 to 90°. In the present embodiment, as shown in FIG. 4, the jetting angle θ is set to 90°. Hence, in this embodiment, the abrasive fluid G is jetted against the flank face 14 of the insert body 11 from a direction opposed to the flank face 14 and perpendicular to the thickness direction. In the illustrated example, the abrasive fluid G is jetted in parallel from the nozzle 24 in the direction of the above-described jetting angle θ; however, the abrasive fluid G may instead be jetted in a conical or other manner centered on a straight line that extends in the direction of the jetting angle θ.

Rotational driving device for rotating the rotating shafts 21 around the axis O are made suitably controllable by a control device (not shown). The control device controls the rotation time (i.e., the length of time that the insert body 11 incurs wet blasting) and number of rotations of the rotating shaft 21 (i.e., the rotational speed of the insert body 11). In the course of a single revolution of the insert body 11 around the axis O, the rotational speed may be intermittently or continuously varied in one or a plurality of preset rotational angle regions with respect to the position that incurs jetting of the abrasive fluid G from the blasting gun 22, and the rotational shafts 21 and insert body 11 may be stopped for a given length of time at one or a plurality of preset rotational angle positions. In addition, jetting the abrasive fluid G from the blasting gun 22 may be controlled by this control device so as to start and stop jetting of the abrasive fluid G and so as to intermittently or continuously vary the jetting pressure of the abrasive fluid G when the insert body 11 is in a given rotational angle region or at a given rotational angle position.

In such a manufacturing method, an insert body 11 whose entire surface, including the flank face 14 and the flank face-side cutting edge portion 15a of the intersecting edge line region 15, has been coated with a base layer 18, an intermediate layer 19 and also an outermost layer 20, is held between the pair of rotating shafts 21. When wet blasting is administered with the blasting gun 22 while rotating the insert body 11, the abrasive fluid G is jetted against the flank face 14 at a jetting angle θ of the abrasive fluid G of 90° and from a direction perpendicular to the thickness direction of the insert body 11. As a result, the outermost layer 20 covering the flank face 14 is removed, in addition to which, in the intersecting edge line region 15 where the flank face 14 and the rake face 13 intersect, the outermost layer 20 is removed from the flank face-side cutting edge portion 15a on the flank face 14 side.

At the same time, at the rake face-side cutting edge portion 15b of the intersecting edge line region 15 and at the rake face 13, the outermost layer 20 remains intact due to the lack of sufficient abrasive action by jetting of the abrasive fluid G. Thus, by controlling the rotation time, the number of rotations and the rotational speed of the rotating shafts 21 as described above and carrying out wet blasting until primarily the intermediate layer 19 is exposed at the flank face 14 and the flank face-side cutting edge portion 15a, the above-described surface-coated cutting insert of the present embodiment can be obtained. Moreover, this wet blasting abrades the flank face 14, enabling the surface roughness thereof to be smoothly finished as described above.

In a surface-coated cutting insert of the above configuration that is manufactured in this way, it is primarily the intermediate layer 19 including chiefly $Al_2O_3$, which has a low coefficient of friction, that is exposed at the flank face 14 and the flank face-side cutting edge portion 15a which will come into contact with the surface of the workpiece to be machined and ultimately shape the machined surface. Hence, scuffing and fluffing on the machined surface due to friction with the workpiece can be prevented, enabling a high-quality machined surface having luster to be formed over an extended period of time, even when cutting a difficult-to-machine material. Accordingly, it is possible to extend the length of time until the operator determines that a cutting edge has reached the end of its useful life and changes the cutting edge in use or the insert itself while at the same time satisfying the desire for enhanced quality of the machined surface (finished surface) of the workpiece that is regarded as so important today in high-precision machining. In this way, the useful life of an insert can be increased, while yet promoting more cost-effective high-precision machining.

At the same time, as described above, the outermost layer 20 that has been adjusted so as to exhibit a bright color such as yellow, cream, gold or a whitish hue in contrast with the blackish hue of the intermediate layer 19 is left coated on at least a portion of the rake face 13 inside of the boundary Q with the intersecting edge line region 15, and particularly, in the present embodiment, on the rake face 13 and on that part of the intersecting edge line region 15 which is the rake face-side cutting edge portion 15b other than the above flank face-side cutting edge portion 15a. Therefore, during cutting, when the chip rubs over the outermost layer 20 of the rake face 13, scraping off the outermost layer 20 or discoloring it due to frictional heat generated by such rubbing, these changes can be easily discerned even in a operational site of cutting work with less than adequate lighting, enabling the operator to reliably determine whether a cutting edge 16 has been used or is unused. This makes it possible to prevent the reuse of a spent cutting edge 16 or, conversely, the discarding of an insert body 11 having unused cutting edges 16 remaining thereon.

In the surface-coated cutting insert of the present embodiment, given that the intermediate layer 19 exposed on the flank face 14 is smoothly finished to a surface roughness, expressed as the arithmetic mean roughness Ra at a cutoff value of 0.08 mm, based on JIS B0601-1994 (2001), of 0.3 µm or less, and preferably 0.2 µm or less, and given also that the intermediate layer 19 includes chiefly $Al_2O_3$, which has a low coefficient of friction, an even higher quality machined surface can be obtained. Moreover, if the base layer 18 and/or the outermost layer 19 has a layer formed of carbides, nitrides, oxides, or borides of one selected from the group consisting of periodic table Group IVa metals, Group Va metals, Group VIa metals, aluminum and silicon, or complex compounds thereof, by using titanium, zirconium, hafnium or chromium as the metal, a good cutting performance and good coating treatment cost-effectiveness can both be achieved even when the surface-coated cutting insert is mass-produced, thus making it possible to enhance the machinability while holding down production costs.

Moreover, in the above-described method for manufacturing such surface-coated cutting inserts of the present invention, after the surface of the insert body 11 has been coated with a base layer 18, an intermediate layer 19 and an outermost layer 20 as in the prior art, the outermost layer 20 can be removed from at least the flank face 14 and the flank face-side cutting edge portion 15a, excluding at least certain portion of the rake face 13 inside the boundary Q. It thus suffices to merely add the outermost layer 20 removal step which is carried out as a subsequent step in prior-art manufacturing methods. Hence, compared with a process in which, for example, the insert body 11 which has been coated with up to the intermediate layer 19 is taken out from the coating furnace and each of the areas where the intermediate layer 19 is to be left exposed is masked, and then the insert body 11 is again placed in the coating furnace and coated with the outermost layer 20, the manufacturing method of the present invention is better suited for mass production and is more efficient and cost-effective. Furthermore, no unwanted coating of the outermost layer 20 over the intermediate layer 19 on the flank face 14 and the flank face-side cutting edge portion 15a occurs as a result of, for example, unintentional peeling of the masking material. It is thus possible to stably, reliably and cost-effectively manufacture surface-coated cutting inserts which exhibit outstanding effects such as those described above.

Also, in the manufacturing method of the present embodiment, because wet blasting is used to remove the outermost layer 20, the working energy is lower than removal of the outermost layer 20 by methods which involve, for example, grinding with an elastic grindstone or abrasion with a brush containing an abrasive or diamond paste. As a result, defects such as grinding scratches do not form on the surface of the exposed intermediate layer 19, the surface roughness of the flank face 14 is not degraded, and the toughness of the insert itself does not decrease. Moreover, this wet blasting abrasive enables a smooth flank face 14 like that described above to be obtained. In addition, because the working energy does not concentrate at the intersecting edge line region 15 that juts out on the insert body 11 where the rake face 13 and the flank face 14 intersect and where the cutting edge 16 is to be formed, over-treatment does not occur.

Also, in the present embodiment, because wet blasting is carried out while clamping and holding the insert body 11 between a pair of rotating shafts 21 and rotating the insert body 11, the abrasive fluid G can be jetted uniformly over the entire periphery where the outermost layer 20 on the surface of the insert body 11 is to be removed. This allows non-uniformity in the removal of the outermost layer 20 to be minimized, thus enabling the stable production of surface-coated cutting inserts of stable quality and, with automation of the blasting treatment, makes it possible to provide a cost-effective manufacturing method which is even more suitable for mass production.

In addition, by controlling the rotational time and number of rotations of the rotating shafts 21 using a control device as described above, varying the rotational speed of the rotating shafts 21 in a preset rotational angle region, stopping the rotating shafts 21, or controlling the jetting of the abrasive fluid G, as described above, it is possible to administer wet blasting for a long period of time or at a high jetting pressure solely at, for example, the vicinity of a corner region 17 to be used as the cutting edge 16, thus enabling the outermost layer 20 to be reliably removed. Alternatively, corresponding to the varying, with rotation of the insert body 11, of the distance between the blasting gun 22 and the flank faces 14 to be formed on sidewalls of an insert body 11 having a polygonal plate shape, or the intersecting edge line regions 15 to be formed at the edges of the polygonal faces, it is possible to adjust the length of time or the jetting pressure at which these flank faces 14 or intersecting edge line regions 15 are subjected to wet blasting.

Figure 23:
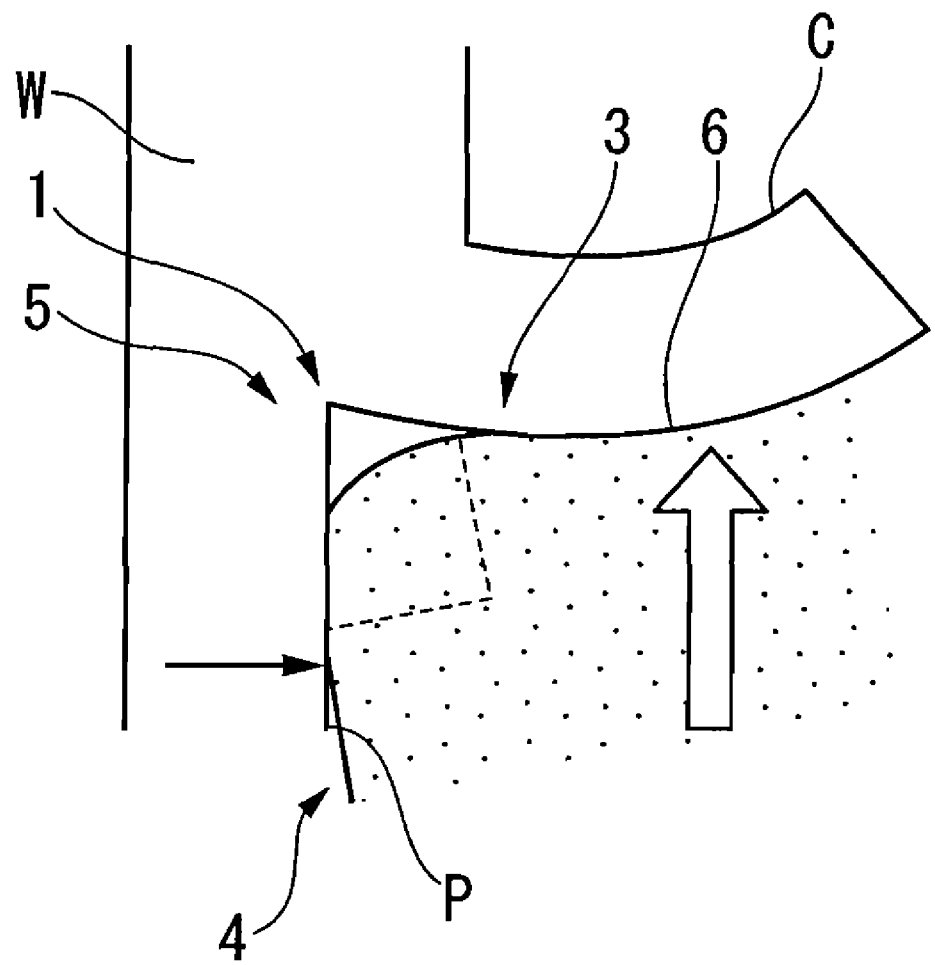
FIG. 23 illustrates a workpiece W being cut with the cutting insert shown in FIG. 21, at a stage where the flank face has incurred wear.

Here, because it will be the flank face-side cutting edge portion 15a of the intersecting edge line region 15 where the cutting edge 16 is formed and later, as wear proceeds (see FIG. 23), the flank face 14 which comes into contact with the workpiece and ultimately forms the machined surface, the area where the outermost layer 20 is removed and primarily the intermediate layer 19 is left exposed should include at least the flank face 14 and the flank face-side cutting edge portion 15a making up part of the intersecting edge line region 15 that is continuous with the flank face 14.

Figure 5:
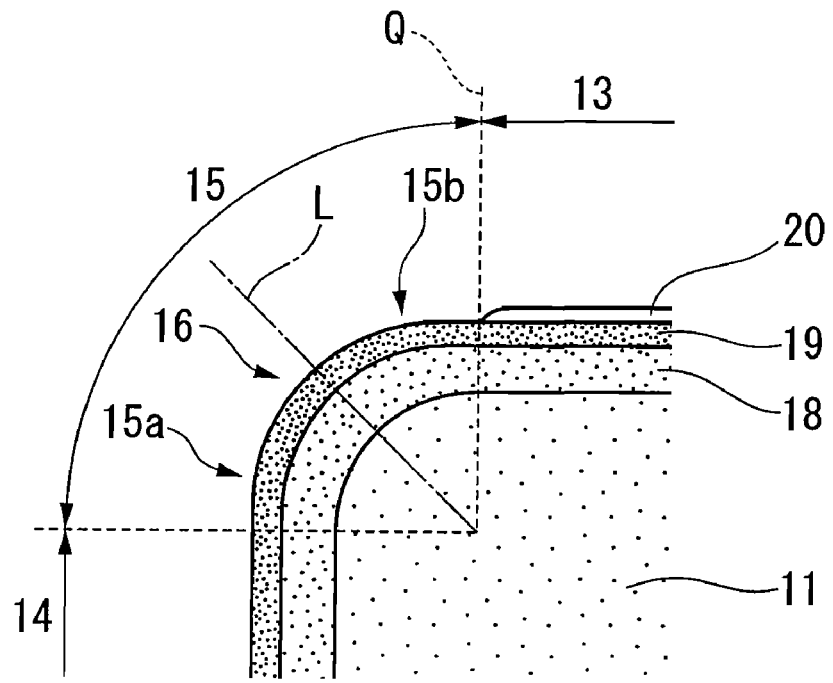
FIG. 5 is an enlarged, cross-sectional view of a variation of the embodiment shown in FIG. 1, taken perpendicular to the intersecting edge line region 15 where the cutting edge 16 is formed.
Figure 6:
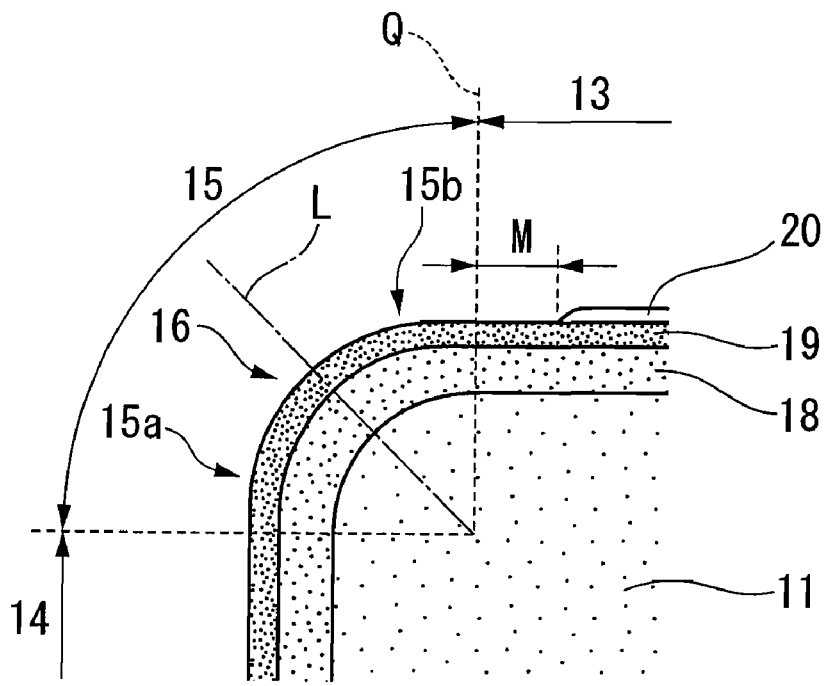
FIG. 6 is an enlarged, cross-sectional view of another variation of the embodiment shown in FIG. 1, taken perpendicular to the intersecting edge line region 15 where the cutting edge 16 is formed.

In the present embodiment, the outermost layer 20 remaining on the rake face 13 side covers the rake face 13 and the rake face-side cutting edge portion 15b of the intersecting edge line region 15 which is continuous with the rake face 13. However, as noted above, on condition that this outermost layer 20 is retained and the used or unused state of the cutting edge 16 can be distinguished in the region where rubbing by the chip occurs during cutting, as shown in FIG. 5, the outermost layer 20 may remain over all of the rake face 13 inside of the boundary Q; that is, on the flank face 14 and all of the intersecting edge line region 15, the outermost layer 20 may be removed so as to leave exposed primarily the intermediate layer 19. Or, as shown in FIG. 6, the outermost layer 20 may be left remaining on a region further separated by a distance M to the inside of the rake face 13 from this boundary Q; that is, the outermost layer 20 may be removed so as to leave exposed the intermediate layer 19 up to a region inside of the rake face 13 from the boundary Q. In such cases, because the intermediate layer 19 including chiefly $Al_2O_3$, which has a low coefficient of friction, is exposed in the intersecting edge line region 15 where the cutting edge 16 is formed and on the cutting edge 16 side of the rake face 13, diffusion-type crater wear and smearing are prevented, enabling the time until the cutting edge is changed to be further extended.

When, as shown in FIG. 6, the outermost layer 20 is removed to a position inside of the rake face 13 from the boundary Q, if the distance M is large and the outermost layer 20 is removed too far inside the rake face, the ability to determine whether a cutting edge is used or unused may be lost. Therefore, even in such a case, it is desirable for the outermost layer 20 to be removed so that the distance M inside of this rake face 13 from the boundary Q between the intersecting edge line region 15 and the rake face 13 is within a range of 2 mm, and for the outermost layer 20 to remain intact inside therefrom.

Figure 7:
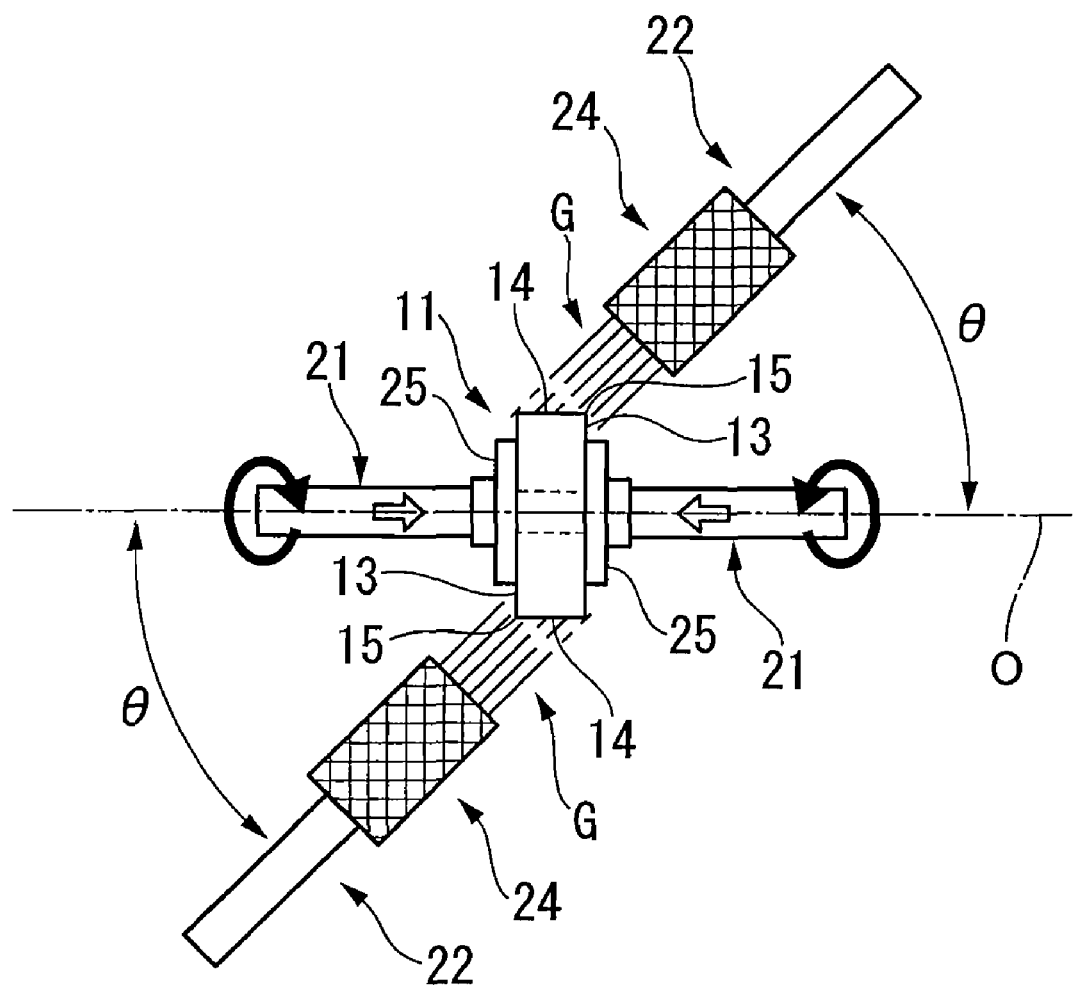
FIG. 7 is a diagram illustrating another embodiment of the manufacturing method of the present invention.

FIG. 7 shows another embodiment of the manufacturing method of the present invention which is preferred for more reliably manufacturing surface-coated cutting inserts in which, as shown in FIG. 5, the outermost layer 20 remains over all of the rake face 13 inside of the boundary Q, and the intermediate layer 19 is left exposed on the flank face 14 and all of the intersecting edge line region 15; and inserts in which, as shown in FIG. 6, the outermost layer 20 remains on a region separated by a given distance M inside the rake face 13 from the boundary Q, and the intermediate layer 19 is left exposed on the flank face 14, the intersecting edge line region 15 and the rake face 13 up to this region.

In this embodiment, instead of the caps 23 used in the embodiment shown in FIGS. 3 and 4, masking members 25 are mounted on the front ends of the rotating shafts 21. These masking members 25 are, in the present embodiment, each mounted on the front ends of the pair of rotating shafts 21 so as to, when the insert body 11 is clamped therebetween, come into close contact with and mask at least part of the rake face 13 where the outermost layer 20 is to be left intact. As with the caps 23 described above, these masking members 25 may be made of an elastic material having good adhesion such as a hard urethane rubber.

That is, when manufacturing a surface-coated cutting insert in which, as shown in FIG. 5, the intermediate layer 19 is exposed on the flank face 14 and up to the entire intersecting edge line region 15, the masking members 25 have outside shapes equivalent to the contour of the boundary Q and are closely contacted to the rake face 13. Alternatively, when manufacturing a surface-coated cutting insert in which, as shown in FIG. 6, the intermediate layer 19 has been left exposed to a range separated by exactly a given distance M inside of the rake face 13 from the boundary Q, the masking members 25 have outside shapes smaller by exactly the distance M than the contour of the boundary Q and are closely contacted to the rake face 13.

Moreover, in this embodiment, a plurality of (in the present embodiment, two) blasting guns 22 are positioned on opposite sides of the axis O of the rotating shafts 21 and also on opposite sides in the thickness direction (direction of the axis O) of the insert body 11 so that their respective nozzles 24 face the insert body 11. These blasting guns 22 each have the same jetting angle θ with respect to the axis O and are set at an acute angle of less than 90°. In the present embodiment, jetting of the abrasive fluid is carried out with the respective nozzles 24 on the two blasting guns 22 oriented at the flank faces 14 of the insert body 11 and either at the intersecting edge line regions 15 to be formed at the edges of the polygonal faces on mutually opposing sides of the insert body 11 or at the portions of the rake faces 13 formed on the polygonal faces on the opposite sides of the insert body 11 that project out beyond the masking members 25.

Therefore, in such a manufacturing method, areas where the outermost layer 20 is to remain are masked with the above masking member 25 so that only those areas where the outermost layer 20 is to be removed are subjected to wet blasting. As a result, whether the outermost layer 20 is removed from only the flank face 14 and the intersecting edge line region 15 or is removed from a region that extends up to the above-described distance M inside the rake face 13, the outermost layer 20 can be reliably removed over only a given region, thus making it possible to prevent difficulties in distinguishing whether a cutting edge 16 is used or unused due to excess removal of the outermost layer 20. Moreover, because the masking members 25 are mounted on the front ends of the rotating shafts 21, masking can be carried out by merely clamping the insert body 11 between the rotating shafts 21, which has the additional advantage of simplifying the required operations.

In addition, in the present embodiment, wet blasting is applied with a plurality of blasting guns 22 to the flank faces 14 and to the intersecting edge line regions 15 and rake faces 13 of the polygonal faces on the mutually opposing sides of the insert body 11, and is thus efficient. Moreover, each of the blasting guns 22 carries out wet blasting at a jetting angle θ, relative to the axis O from the rake face 13 side, which is set at an acute angle of less than 90°, thus enabling the outermost layer 20 to be removed from the intersecting edge line region 15 and the rake face 13 on one polygonal face of the insert body 11 while also enabling the outermost layer 20 to be reliably removed from the flank face 14. Yet, when the jetting angle θ is set to an acute angle in this way, as the jetting angle θ becomes smaller, the angle of incidence of the abrasive fluid G to the flank face 14 also becomes smaller, and removal of the outermost layer 20 on the flank face 14 becomes more difficult. Accordingly, this jetting angle θ is set to preferably 10° or more, and more preferably 30° or more.

Figure 8:
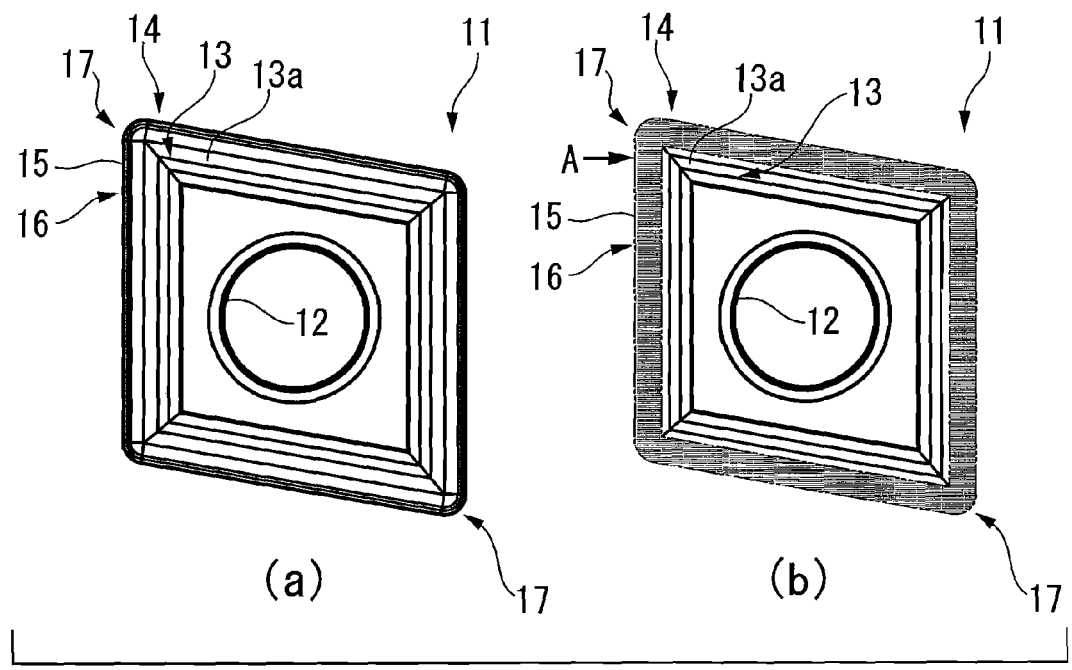
FIG. 8 shows a first surface-coated cutting insert manufactured by the method illustrated in FIG. 7, both (a) before wet blasting and (b) after wet blasting.

FIG. 8 shows a case in which a surface-coated cutting insert is administered wet blasting by such a manufacturing method. Here, and also in each of the subsequently described FIGS. 9 to 13, the (a) diagram shows the insert body 11 when it is entirely coated with the outermost layer 20, and the (b) diagram shows the insert body 11 when, following wet blasting, the outermost layer 20 has been removed to the inside of the rake face 13 from the boundary Q. In the (b) diagrams of FIGS. 8 to 13, the dotted areas indicate areas where the outermost layer 20 has been removed by wet blasting.

The cutting insert shown in FIG. 8 is a CNMG120408 type cutting insert in which a recessed chipbreaker groove 13a has been formed over the entire periphery on the inside of a polygonal face (rhombic face) where the rake face 13 is to be formed. The outermost layer 20 has been removed from the flank face 14, from all of the intersecting edge line region 15 that has been round honed, and from a fixed region that extends a distance (the distance at the position indicated by the arrow A in FIG. 8(b)) M of 1.0 mm inside the rake face 13 from the boundary Q with the intersecting edge line region 15. In the example shown, the boundary line between the intermediate layer 19 exposed by such removal of the outermost layer 20 and the outermost layer 20 remaining inside the rake face 13 is positioned inside the chipbreaker groove 13a.

However, the above-mentioned distance M of the region over which the outermost layer 20 is removed inside the rake face 13 from the boundary Q is specified only for, of the insert body 11, the portion of the rake face 13 inside the intersecting edge line region 15 where the cutting edge 16 that will actually take part in cutting is formed. At the inside portion of the intersecting edge line region 15 which will not take part in cutting, and which will therefore also not take part in distinguishing whether the cutting edge 16 is used or unused, the outermost layer 20 may be removed to the inside of the above-described distance M or, conversely, the outermost layer 20 may be left in place on the intersecting edge line region 15 or even on the portion of the flank face that intersects therewith. For example, in the cutting insert of rhombic shape depicted in the above-described embodiment, generally, of the cutting edges 16 formed in the intersecting edge line regions 15 at the edges of the rhombic faces, exclusive use is made at the corners of the rhombic shape, particularly, as described above, the cutting edge 16 portions formed at the edges on the acute corner 17 sides. Therefore, on the portions applied exclusively for cutting, it suffices to leave the outermost layer 20 intact in a range inside of the above-described distance M.

Figure 9:
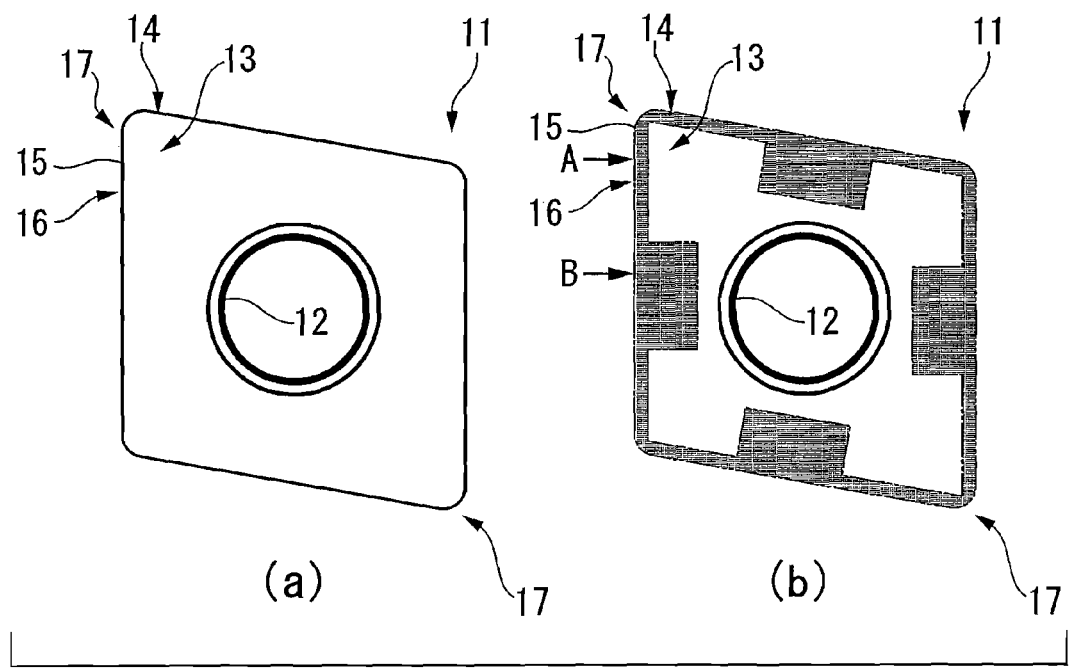
FIG. 9 shows a second surface-coated cutting insert manufactured by the method illustrated in FIG. 7, both (a) before wet blasting and (b) after wet blasting.
Figure 10:
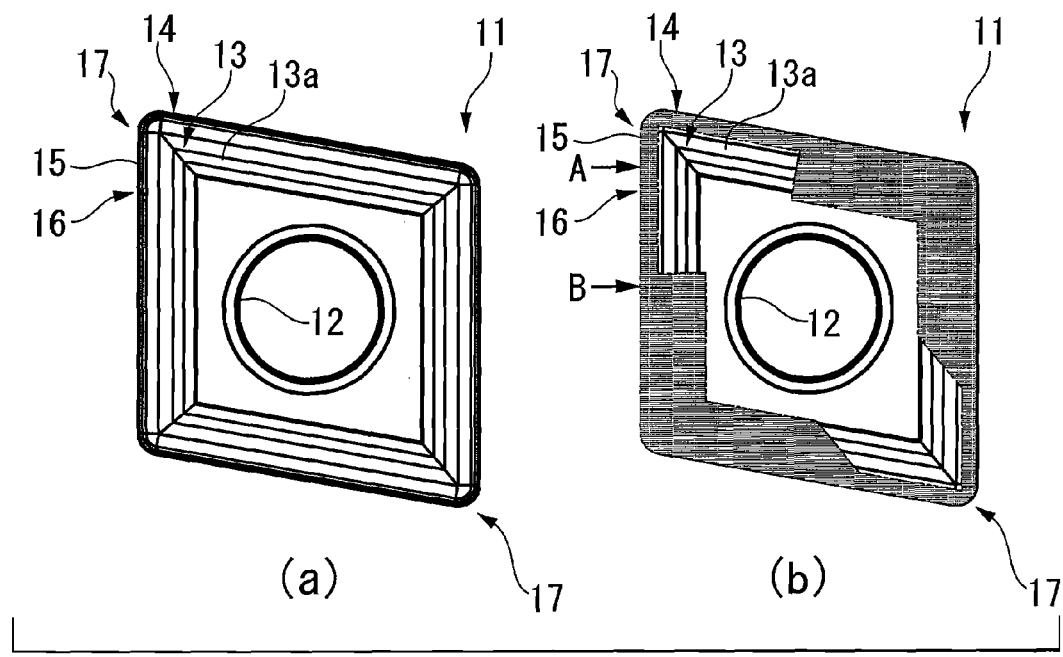
FIG. 10 shows a third surface-coated cutting insert manufactured by the method illustrated in FIG. 7, both (a) before wet blasting and (b) after wet blasting.

FIGS. 9 and 10 show cases in which wet blasting is administered to surface-coated cutting inserts so that the outermost layer 20 is removed beyond the above-described distance M inside the rake face 13 in areas extending from the intersecting edge line region 15 that do not thus take part exclusively in cutting. As in FIG. 8, FIG. 10 shows a CNMG120408 type cutting insert. FIG. 9 shows a CNMA120408 type cutting insert with a flat top that lacks a chipbreaker groove 13a.

In the cutting insert shown in FIG. 9, at each edge of the rhombic face, the outermost layer 20 is removed at both ends thereof which connect to the acute corners 17 and the obtuse corners of this rhombic face, over a fixed range extending a distance (the distance at the position of arrow A in FIG. 9(b)) M of 0.5 mm inside the rake face 13 from the boundary Q with the intersecting edge line region 15; and the outermost layer 20 is removed at a center portion of each edge which does not take part in cutting, over a fixed range extending a greater distance (the distance of the arrow B in FIG. 9(b)) M of 2.5 mm. Between these areas, the boundary line of the remaining outermost layer 20 with the intermediate layer 19 exposed by removal of the outermost layer 20 has a stepped shape which extends perpendicular to the intersecting edge line region 15.

In the cutting insert shown in FIG. 10, the outermost layer 20 is removed, in only those portions of the respective edges on the rhombic face which continue to the acute corners 17, over a fixed region extending a distance (the distance at the position of the arrow A in FIG. 10(b)) M of 0.6 mm inside the rake face 13 from the boundary Q with the intersecting edge line region 15. In addition, the outermost layer 20 is removed also, in those areas which continue from the center portion of the respective edges to the obtuse corners, over a fixed region extending a greater distance (the distance of the arrow B in FIG. 10(b)) M of 2.5 mm than the side of the acute corners 17.

In the wet-blasted, surface-coated cutting insert shown in FIG. 10(b), the boundary lines between the remaining outermost layer 20 and the intermediate layer 19 exposed by removal of this outermost layer 20 are shaped so as to extend perpendicularly to the intersecting edge line region 15 at the one acute corner 17 (the upper acute corner 17 in FIG. 10(b)) of the rhombic face, and so as to extend diagonally to the intersecting edge line region 15 at the other acute corner 17 (the lower acute corner 17 in FIG. 10(b)), with the boundary lines on either side of the latter corner 17 being parallel to each other. That is, the shapes, as seen from above, of the remaining outermost layer 20 that are demarcated by the foregoing boundary lines are made to differ between the plurality of corners 17 on the polygonal plate-shaped cutting insert 11. This makes it easy to establish a sequence of use for the cutting edges 16 formed at the intersecting edge line regions 15 on the edges that extend between the respective corners 17. Together with facilitating identification between used and unused cutting edges due to discoloration and the like of the outermost layer 20, such an arrangement makes it possible to more reliably prevent the reuse of spent cutting edges 16 and the discarding of cutting inserts which still have unused cutting edges 16.

Furthermore, in the surface-coated cutting inserts shown in FIGS. 8 to 10, the outermost layer 20 is removed over a region extending a fixed distance M inside the rake face 13 from the boundary Q with the intersecting edge line region 15 where the cutting edge 16 that takes part in cutting has been formed. That is, in areas which take part in cutting, the boundary lines between the remaining outermost layer 20 and the exposed intermediate layer 19 are made to extend parallel to the intersecting edge line region 15, in a plan view, facing the rake face 13. However, as shown in FIG. 11 for example, the distance M may be varied along the intersecting edge line region 15 within a range in the distance M from the boundary Q of up to 2.0 mm.

Figure 11:
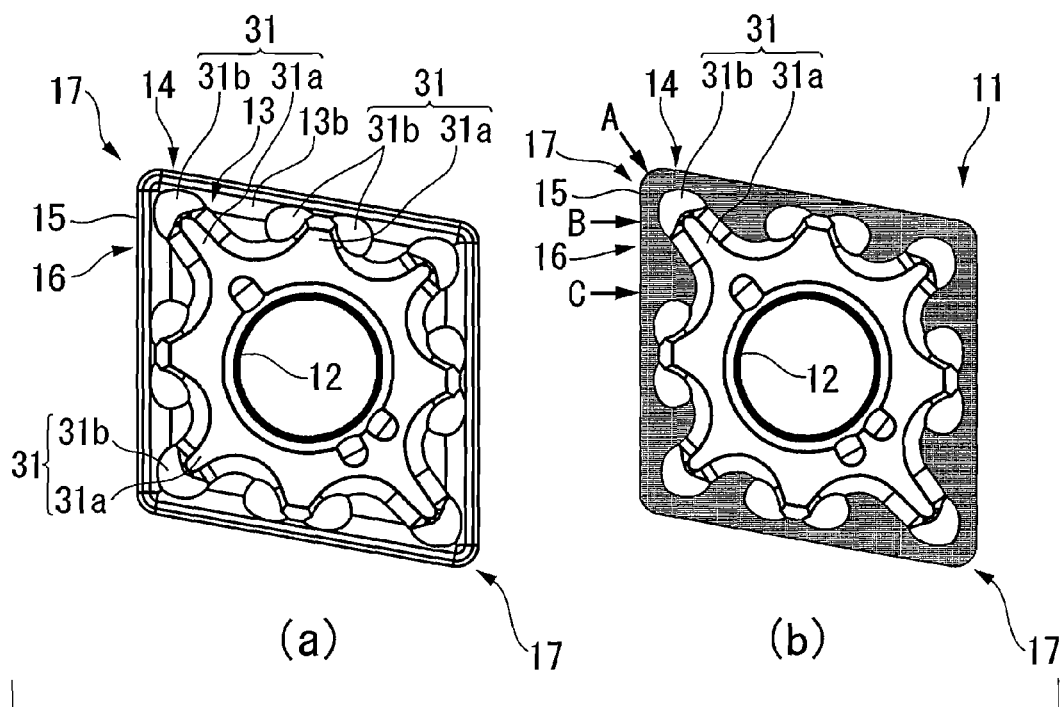
FIG. 11 shows a fourth surface-coated cutting insert manufactured by the method illustrated in FIG. 7, both (a) before wet blasting and (b) after wet blasting.

In the cutting insert shown in FIG. 11, at the protruding end of the acute corner 17 which alone takes part in cutting operation on the rhombic face where the rake face is formed, the above distance M at the position of arrow A in FIG. 11(b) is set to 0.9 mm, and in areas where the cutting edge 16 located a little distance therefrom toward the obtuse corner side is linear, the distance M at the position of the arrow B in FIG. 11(b) is set to 0.6 mm, which is the minimum distance M in the areas that take part in cutting. From this place where the distance M is at its smallest, the distance M gradually increases toward the center portion of the edge of the rhombic face, the outermost layer 20 being removed in such a way that the distance M at the position of the arrow C in FIG. 11(b) at the center portion which takes part in the rough cutting of large depth of cut, reaches a maximum of 2.0 mm.

In the cutting insert shown in FIG. 11, inclined faces 13b which gradually retreat toward the inside of the rake face 13 are formed on the inside of the rake face 13. In addition, on the rake face 13 where these inclined faces 13b have been formed, there are provided raised chipbreakers 31 having projections 31a which extend from the center of the rhombic face (polygonal face) toward at least the acute corners 17 and spherical projections 31b which are formed at distal ends of the projections 31a and giving an interval with the intersecting edge line region 15. Projections 31a of the first type are formed so as to extend toward the obtuse corners and toward the center of each edge, and projections 31b of the second type are formed at distal ends of the projections 31a that extend toward the obtuse corners and at both sides of the projections 31a which extend toward the centers of the edges of the rhombic face. The boundary line at the rake face 13 between the exposed intermediate layer 19 and the remaining outermost layer 20 extends in such a way as to follow the boundary line between the rake face 13 including the inclined faces 13b and the chipbreakers 31, including both those formed near the obtuse corners and those formed near the centers of the edges.

FIGS. 8 to 11 illustrate cases in which the present invention is applied to surface-coated cutting inserts having a rhombic shape with, in particular, angles of 80° at the acute corners 17. However, the present invention can of course be applied as well to surface-coated cutting inserts in the form of substantially equilateral triangular plates like that shown in FIG. 12 or other types of polygonal plates or plates having circular or other curved shapes, or even to cutting inserts having non-planar shapes. Moreover, as shown in FIG. 13, the present invention may be applied to cutting inserts which have a different angle at the acute corners 17, although having a rhombic shape. Furthermore the present invention may be also applied to the cutting edges 16 having a curved shape being contoured, a wavy shape of the sort used in roughing cutters, as seen in a plan view facing the rake face 13, or the cutting edges 16 exhibiting a wavy shape as seen in a side view facing the flank face 14 by making the rake face 13 along the intersecting edge line region 15 where the cutting edge 16 is formed contoured as shown in FIG. 14, instead of cutting edges 16 which extend linearly in places other than the corners 17.

Figure 12:
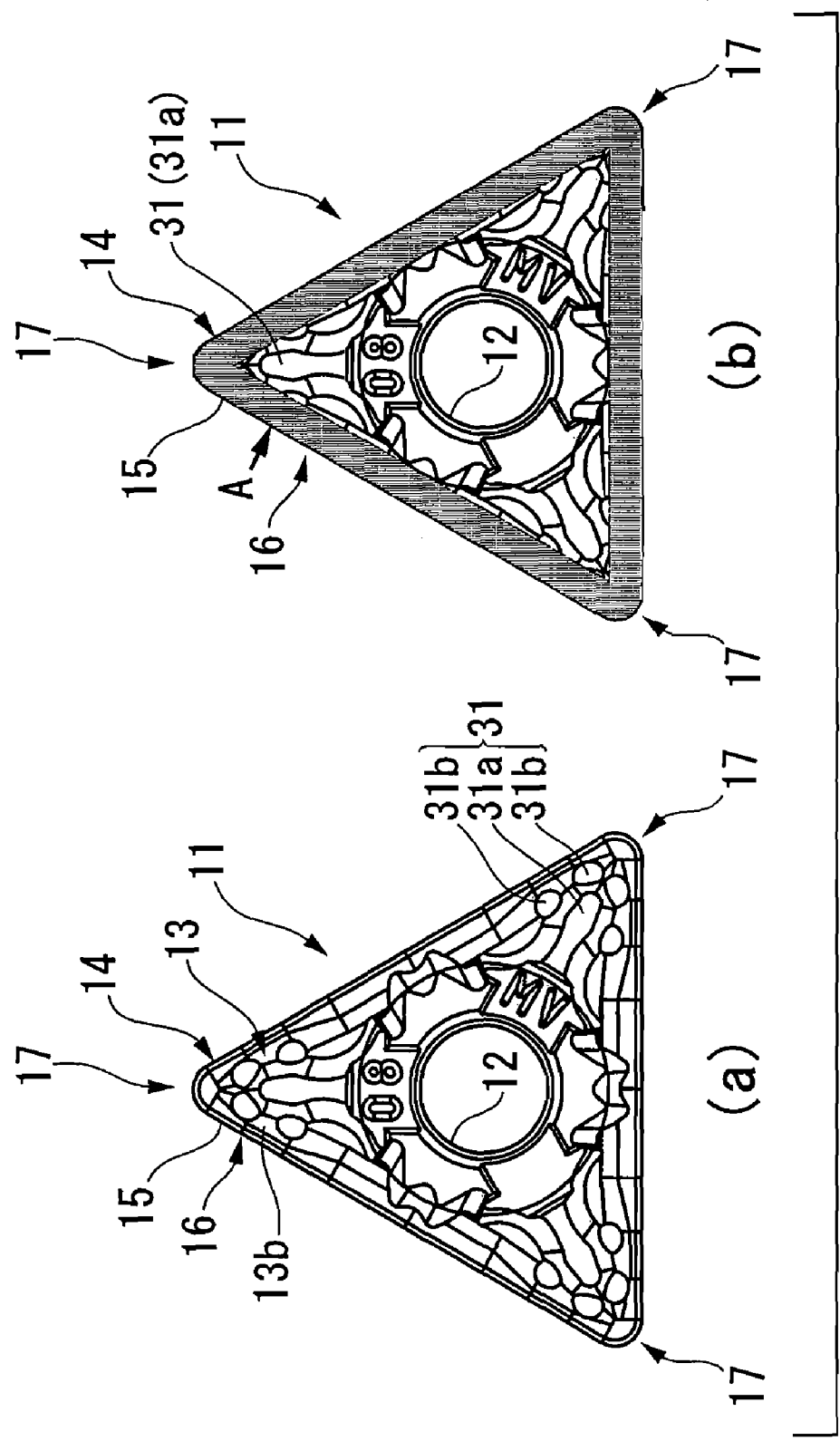
FIG. 12 shows a fifth surface-coated cutting insert manufactured by the method illustrated in FIG. 7, both (a) before wet blasting and (b) after wet blasting.
Figure 13:
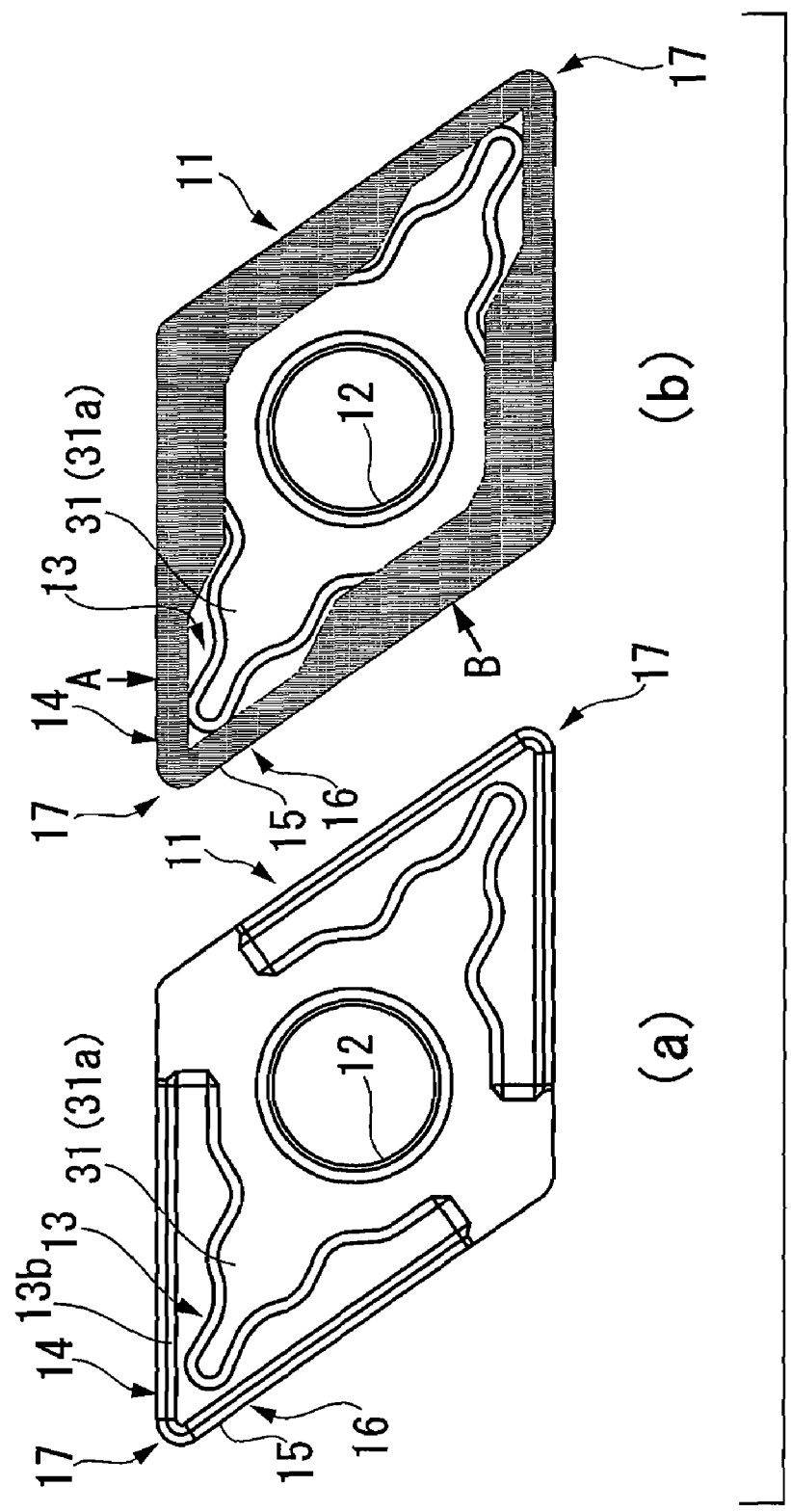
FIG. 13 shows a sixth surface-coated cutting insert manufactured by the method illustrated in FIG. 7, both (a) before wet blasting and (b) after wet blasting.

The cutting insert shown in FIG. 12 is a TNMG160408 type insert which has inclined faces 13b of the same type as described above formed inside the rake face 13, and has a chipbreaker 31 with projections 31a of a first type that extend toward each vertex of the polygonal face (a substantially equilateral triangular face) where the rake face has been formed, and projections 31b of a second type that are symmetrically formed in a plurality thereof on either side of the first type of projection 31a. The boundary line between the intermediate layer 19 and the outermost layer 20, which is independent of the boundary line between the rake face 13 and the chipbreaker 31, is set so that the distance M (the distance at the position of arrow A in FIG. 12(b)) from the boundary Q between the intersecting edge line region 15 and the rake face 13 is 1.0 mm and constant over the entire periphery of the polygonal face.

The cutting insert shown in FIG. 13 is a DNMG150408 type insert having an inclined face 13b of a small width formed inside the rake face 13 and having formed further inside therefrom a flat face which is perpendicular to the thickness direction of the insert body 11. Chipbreakers 31 are formed solely of projections 31a of a width that narrows in a stepwise fashion toward the acute corners 17. On the side of these acute corners 17 which take part in cutting, the above distance M (the distance at the position of the arrow A in FIG. 13(b)) is set to 1.0 mm, and on the side of the obtuse corners which do not participate in cutting, the distance M (the distance at the position of the arrow B in FIG. 13(b)) is set to 2.2 mm, which is a size that exceeds 2.0 mm.

Figure 14:
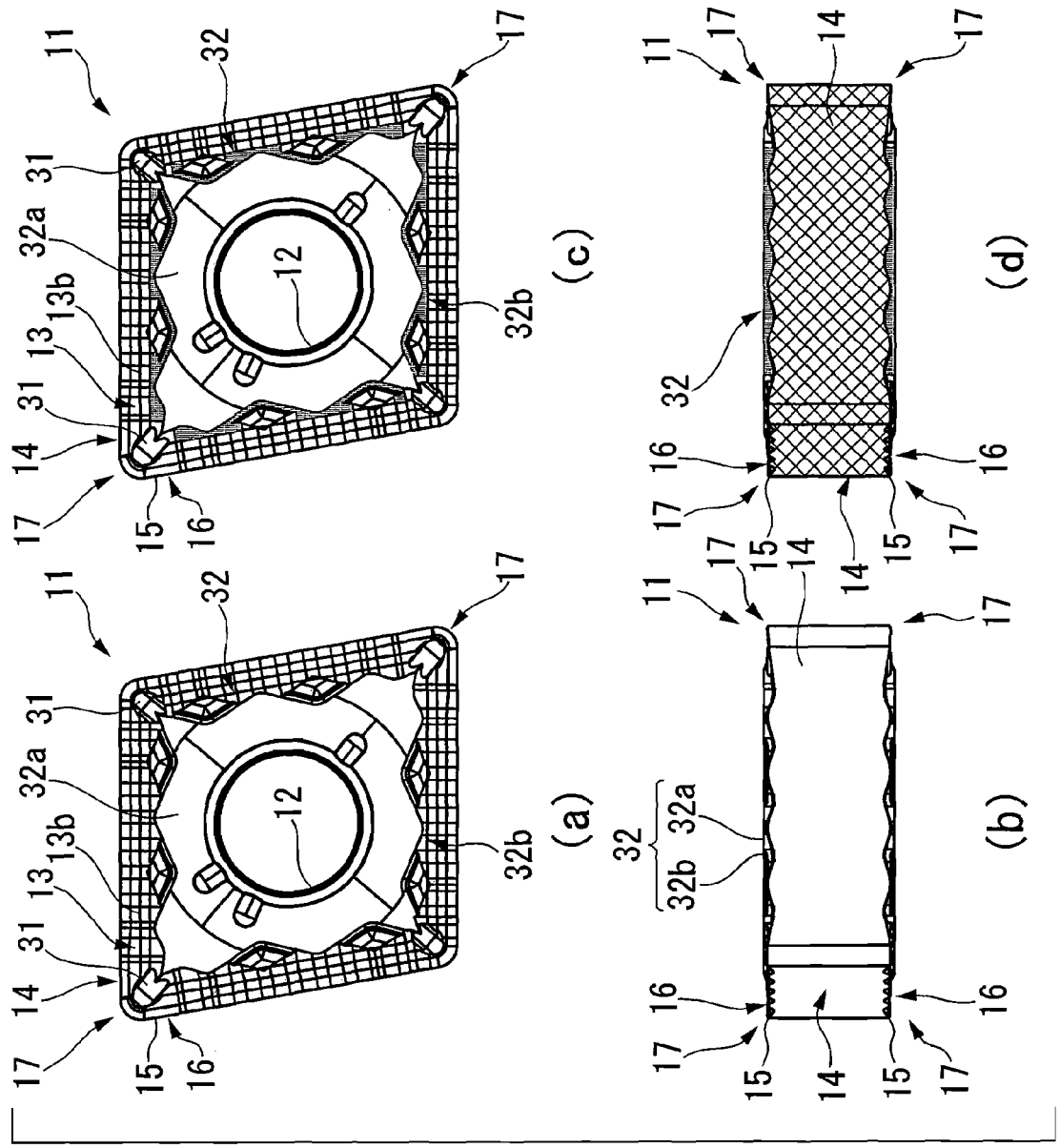
FIG. 14 shows a surface-coated cutting insert manufactured by the method illustrated in FIG. 4, (a) being a plan view before wet blasting, (b) being a side view before wet blasting, (c) being a plan view after wet blasting, and (d) being a side view after wet blasting.

Wet blasting treatment in which, as shown in FIG. 4, the jetting angle θ was set to 90° and masking members were not used was carried out on the CNMG120408 type cutting insert shown in FIG. 14. Chipbreakers (e.g., SH breakers made by Mitsubishi Materials Corporation) 31 are formed at the acute corners 17 and the obtuse corners of the rake face 13 on this insert. Moreover, inside this rake face 13 which is uneven as described above, a raised area 32 having a boss face 32a which is in higher relief than the rake face 13 and the cutting edge 16 that exhibits a wavy shape as shown in FIG. 14(b) and which has been given a shape perpendicular to the thickness direction of the insert body 11 is formed around the opening of the mounting hole 12. The outermost layer 20 has been removed from the flank face 14, the flank face-side cutting edge region 15a, and the inclined wall (the dotted areas in FIGS. 14(c) and (d)) 32b of the raised area 32 which rise up from the rake face 13 to the boss face 32a, leaving the intermediate layer 19 exposed.

That is, in this type of cutting insert, because the abrasive fluid also strikes the inclined wall 32b with certain angle of incidence, the outermost layer 20 may be partially removed, exposing the blackish-colored intermediate layer 19. However, even in such cases, by leaving the outermost layer 20 on the rake face 13, the effects of the present invention can be fully achieved. In FIG. 14(d), because fully dotting the flank face 14 where the intermediate layer 19 is exposed as in FIGS. 8(b) to 13(b) would make it impossible to distinguish these areas from the inclined walls 32b, the flank face 14 is indicated instead as a mesh.

In each of the above-described surface-coated cutting inserts, round honing (R honing) which creates a cross-sectional circular arcuate shape is administered at the intersecting edge line regions 15 between the rake faces 13 and the flank faces 14 where the cutting edges 16 are to be formed, thereby rendering that part of the arc in the cross-section of this intersecting edge line region 15 which is continuous with the flank face 14 into a flank face-side cutting edge portion 15a. Alternatively, that part of the intersecting edge line region 15 on the flank face 14 side may be rendered into flank face-side cutting edge portion 15a by administering a honing operation other than such round honing to the intersecting edge line region 15, such as so-called waterfall-type curved honing where the width as seen from the rake face 13 side is larger than the width as seen from the flank face 14 side, curved honing in which, conversely, the width as seen from the rake face 13 side is narrower than the width as seen from the flank face 14 side, chamfer honing, or combination honing in which at least one boundary on the rake face 13 side or flank face 14 side of this chamfer-honed region is rounded into a curved shape.

Also, even in a so-called sharp-edge cutting insert in which such honing has not been administered to the intersecting edge line region 15, and which has been formed so that the rake face 3 and the flank face 4 intersect at an angle, because this intersecting edge line region 15 is left in a state like being honed with a specific, albeit microscopically small, width, it suffices for the outermost layer 20 to be removed so that primarily the intermediate layer 19 is left exposed, at least at the flank face 14 and the flank face-side cutting edge region 15a continuous with the flank face 14.

Figure 15:
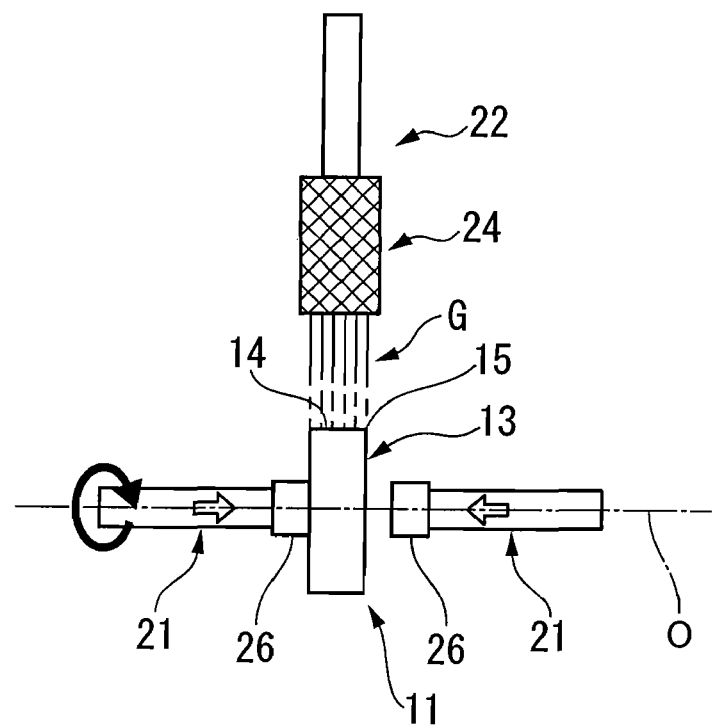
FIG. 15 illustrates the wet blasting of a surface-coated cutting insert having no mounting hole 12.

The manufacturing methods in the above embodiments are described for cases where a negative-type surface-coated cutting insert in which a mounting hole 12 has been formed in an insert body 11 is administered wet blasting to remove the outermost layer 20. However, when wet blasting treatment is administered to a cutting insert without a mounting hole 12, such as a CNMN120408 type insert, in place of the caps 23 having tapered ends shown in FIGS. 3 and 4, caps 26 having an end face which is formed as a flat face perpendicular to the axis O, as shown in FIG. 15, may be used. Of course, by having the end faces of the masking members 25 shown in FIG. 7 formed as flat faces perpendicular to the axis O in the same way as the end faces of these caps 26, it is possible to administer, even to insert bodies 11 lacking a mounting hole 12, wet blasting toward a desired range outside of the area masked with such masking members.

Figure 16:
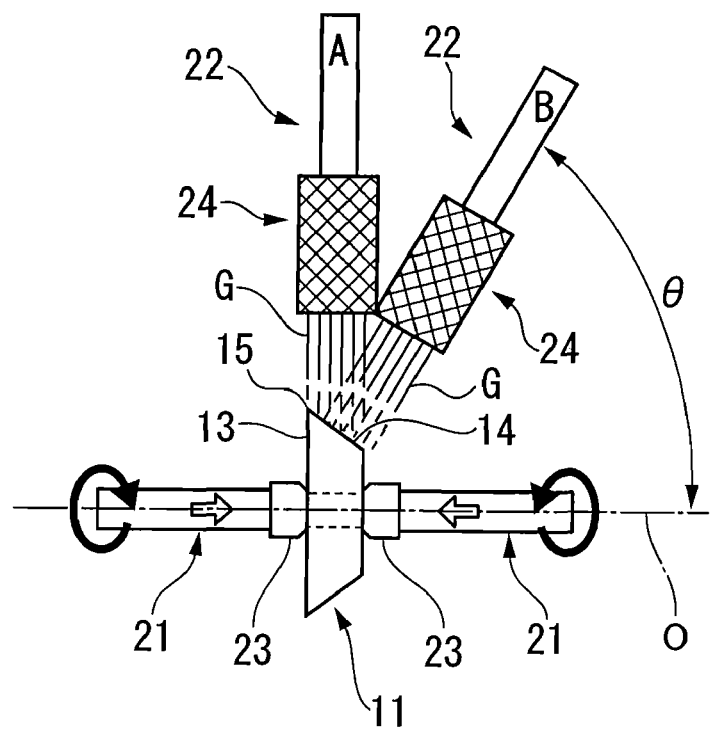
FIG. 16 illustrates the wet blasting of a positive-type surface-coated cutting insert.

In cases where the present invention is applied to positive-type cutting inserts, such as CCMT09T302 type inserts, in which the rake face 13 and the flank face 14 are disposed in directions that intersect at an acute angle, and the flank face 14 has been provided with a clearance angle, as indicated by the symbol A in FIG. 16, the jetting angle θ of the abrasive fluid G from the blasting gun 22 may be set to 90° with respect to the axis O, much in the same way as shown in FIGS. 4 and 15. Alternatively, as indicated by the symbol B in FIG. 16, the jetting angle θ may be made an acute angle with respect to the axis O, facing the side opposite to the rake face 13. The blasting gun 22 may thus be arranged in a manner selected from either of those represented by symbols A and B.

Of these, in the case represented by the symbol B, the jetting angle θ is set in accordance with the clearance angle provided to the flank face 14, enabling the outermost layer 20 to be efficiently removed by bringing the jetting direction of the abrasive fluid G closer to a direction perpendicular to the flank face 14. At the same time, the abrasive fluid G also reaches the flank face-side cutting edge portion 15a of the intersecting edge line region 15, enabling reliable removal of the outermost layer 20 even at this flank face-side cutting edge portion 15a. However, even in this case, if the jetting angle θ is made too small, the outermost layer 20 removing action on the flank face-side cutting edge portion 15a will become weak and inefficient. Hence, the jetting angle is set to at least 10°, and preferably at least 30°.

Examples

The present invention is illustrated more fully in the following examples, and the advantageous effects of the present invention are explained. In these examples, first an insert body having the shape and dimensions specified by CNMG120408 was manufactured from a P10 grade tungsten carbide (WC)-based cemented carbide as the substrate. The intersecting edge line regions where the cutting edges are to be formed were round honed to a radius of 0.06 mm with an abrasive-containing brush. Next, a base layer, an intermediate layer and an outermost layer of the thicknesses and compositions shown in the Table 1 below were coated over the entire surface of the insert body by chemical vapor deposition in this order from the insert body side. After coating was completed, the surface color of the insert body exhibited the bright-hued light yellow color of the outermost layer.

TABLE 1

| Base layer | Intermediate layer | Outermost layer |
| --- | --- | --- |
| 0.5 μm TiN - 10 μm columnar crystal Ti(CN) - 0.5 μm Ti(CO) | 6 μm α-$Al_2O_3$ | 1 μm $Ti_2O_3$ - 0.5 μm Ti(NO) |

Wet blasting treatment was then administered to the resulting surface-coated cutting insert, thereby removing only the outermost layer from the surface over part or substantially all of the insert. In this wet blasting treatment, alumina particles having a particle size of 30 to 60 μm were used as the blasting abrasive. This abrasive was mixed with water as the liquid to form a blasting abrasive fluid, and the content of the abrasive in the fluid was adjusted to 30 wt %. The cutting insert was held by a pair of rotating shafts as shown in FIG. 3 so as to be rotatable around the axis of the shafts, and the abrasive fluid prepared as described above was jetted against the surface of the cutting insert at a jetting pressure of 0.15 MPa from two opposing blasting guns.

In this example, the angle at which the abrasive fluid was jetted with respect to the above axis during wet blasting treatment was varied according to conditions A to D shown in Table 2 below, thereby administering treatment to a total of four types of cutting insert. Table 2 shows the jetting direction by the abrasive fluid against the surface of each insert body, and the state of treatment (state of outermost layer removal) at the surface of the insert body.

TABLE 2

| Condition | Jetting angle | Jetting direction of abrasive fluid | Treatment state at surface of insert body |
| --- | --- | --- | --- |
| A | 90° | Jetted in a direction perpendicular to flank face and parallel to rake face | Primarily flank face and flank face-side cutting edge portion were treated |
| B | 45° | Jetted at jetting angle of 45° with respect to both rake face and flank face, and in a direction substantially perpendicular to center of cutting edge | Substantially entire surface of flank face, cutting edge and rake face were treated |
| C | 45° | Jetted similar to B above, but with entire flank face masked with hard urethane rubber | Primarily rake face and cutting edge were treated |

TABLE 2-continued

| Condition | Jetting angle | Jetting direction of abrasive fluid | Treatment state at surface of insert body |
|---|---|---|---|
| D | 0° | Jetted in a direction perpendicular to rake face, and parallel to flank face | Primarily rake face and rake face-side cutting edge portion were treated |

In addition to cutting inserts from which the outermost layer was removed by wet blasting under these conditions A to D, the following cutting inserts were also fabricated: untreated cutting inserts obtained by simply applying the coatings indicated in Table 1, cutting inserts obtained by grinding in which a rotating elastic grindstone containing abrasive was pressed against the rhombic faces on which the rake face and cutting edges were formed, and cutting inserts obtained by grinding in which a rotating nylon brush containing diamond abrasive was pressed against the rhombic face. Letting the cutting inserts manufactured under condition A in Table 2 be Example 1 according to the present invention and letting the cutting inserts manufactured under the other sets of conditions be respectively Comparative Examples 1 to 6, the treatment conditions, surface colors of the rake faces and the flank faces, state of outermost layer removal, and surface roughness of the flank face in each are shown in Table 3 below.

Figure 17:
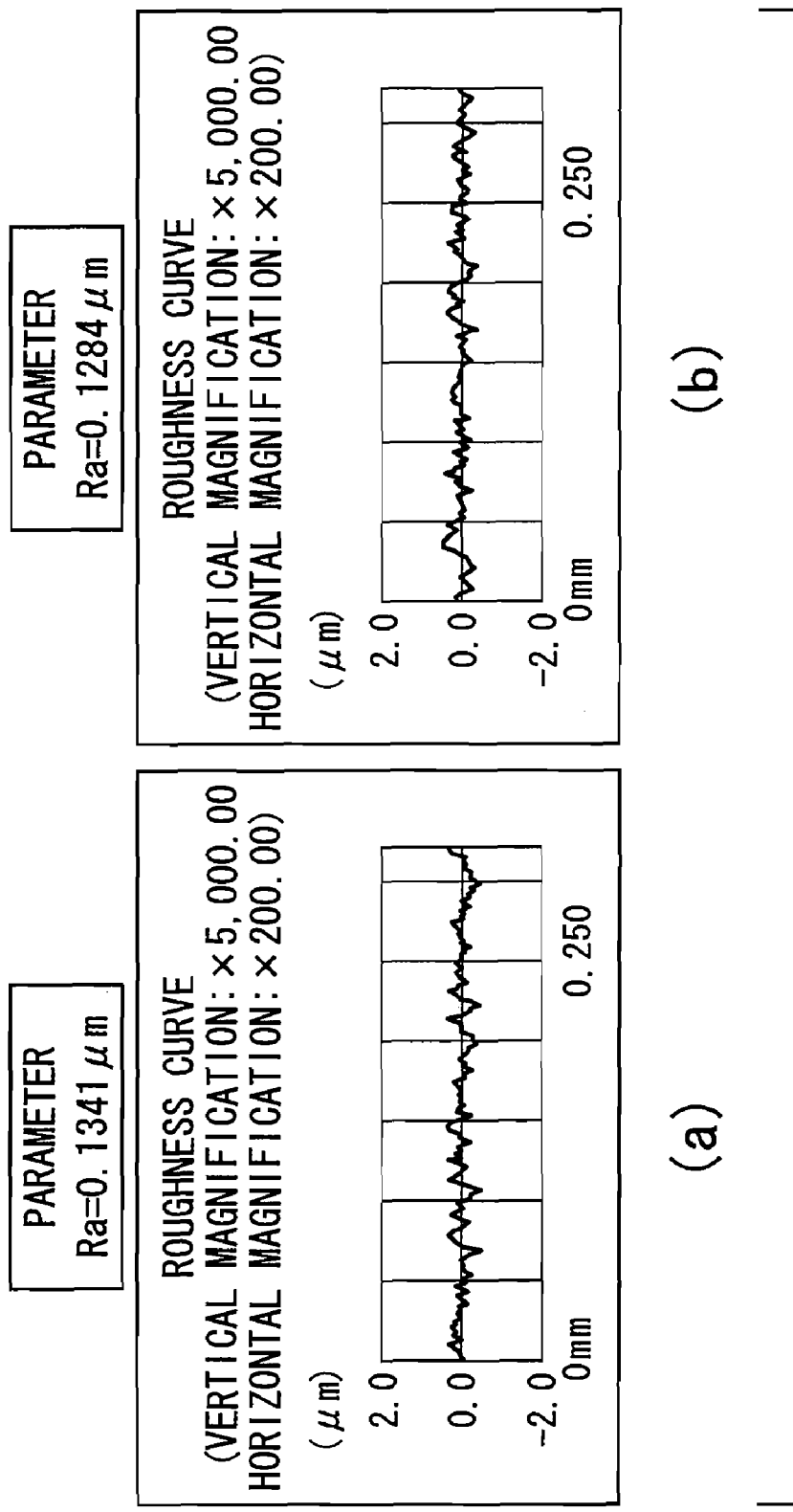
FIG. 17 shows surface roughness curves for the flank face in Example 1.
Figure 18:
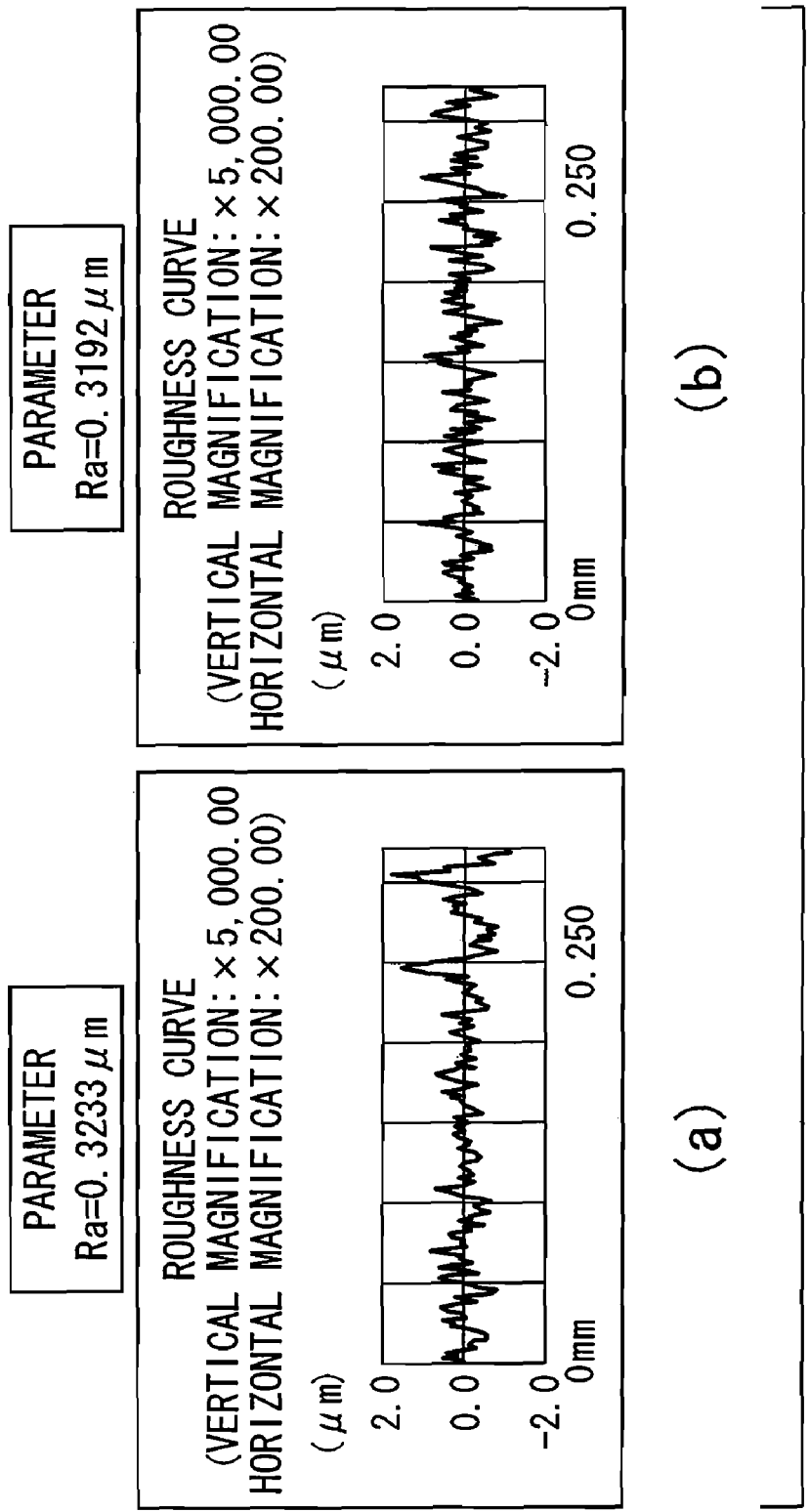
FIG. 18 shows surface roughness curves for the flank face in Comparative Example 1.

Surface roughnesses were obtained by measuring the arithmetical mean roughness Ra (μm) at an offset value of 0.08, based on JIS B0601-1994 (2001), at three lines parallel to the cutting edge and near the center of the flank face in the thickness direction of the insert body. The averages thereof are shown in the table. Roughness curves of actual surface roughness measurements prepared using two of the lines in each case are shown in FIG. 17 for Example 1 and in FIG. 18 for Comparative Example 1. In Comparative Example 5 where grinding was carried out with an elastic grindstone, and in Comparative Example 6 where grinding was carried out with a brush, a plurality of streak-like grinding scratches arose in irregular directions on the intersecting edge line region where the cutting edges are formed and on the rake faces adjacent thereto.

TABLE 3

| | Treatment conditions after coating | Surface color Rake face | Flank face | Outermost layer removal state due to treatment | Surface roughness of flank face |
|---|---|---|---|---|---|
| Example 1 | A | light yellow | blackish | Outermost layer removed from flank face and flank face-side cutting edge portion. | 0.13 μm |
| Comp. Ex. 1 | untreated | light yellow | light yellow | Outermost layer present everywhere on flank face, cutting edge and rake face | 0.32 μm |
| Comp. Ex. 2 | B | blackish | blackish | Outermost layer removed from all of flank face, cutting edge and rake face. | 0.15 μm |
| Comp. Ex. 3 | C | blackish | light yellow | Outermost layer removed from cutting edge and rake face, but present in untreated state on flank face. | 0.32 μm |
| Comp. Ex. 4 | D | blackish | light yellow | Outermost layer removed from rake face and rake face-side cutting edge portion. | 0.31 μm |
| Comp. Ex. 5 | elastic grindstone | dark, lustrous yellow | light yellow | Outermost layer removed from part of cutting edge, but present in substantially untreated state on flank face. | 0.32 μm |
| Comp. Ex. 6 | brush | dark, lustrous yellow | light yellow | Outermost layer removed from part of cutting edge, but present in substantially untreated state on flank face. | 0.32 μm |

These surface-coated cutting inserts of Example 1 and Comparative Examples 1 to 6 were mounted on an insert-removable type turning tool, and machining was carried out by turning a workpiece. The actual cutting time until the cutting edge was changed at this time, the reason for changing the cutting edge, the width of flank wear when the cutting edge was changed, the condition of the machined surface (finished surface) on the workpiece, and the ease of distinguishing whether a cutting edge was used or unused are shown collectively in Table 4 below. Dry cutting was carried out under the following conditions: the work material was low-carbon steel (JIS S10C), the cutting speed was 250 m/min, the feed rate was 0.12 mm/rev, and the depth of cut was 1.5 mm. The actual cutting time until the cutting edge was changed was determined as follows. When the finished surface became inferior, cutting was stopped at that point and the actual cutting time was measured. So long as a good finished surface continued to be achieved, cutting was carried out until the width of flank wear reached 0.3 mm and the actual cutting time until that point was used. The reason is that when the width of flank wear grows to more than 0.3 mm, it usually becomes impossible to maintain the dimensional precision of the machining operation.

TABLE 4

| | Actual cutting time until cutting edge was changed | Reason for changing cutting edge | Width of flank wear when cutting edge was changed | Condition of machined surface (finished surface) when cutting edge was changed | Ease of distinguishing cutting edge after use in cutting |
|---|---|---|---|---|---|
| Example 1 | 35 minutes | flank wear | 0.30 mm | good finished surface having luster | very easy |
| Comp. Ex. 1 | immediately after start of cutting | poor finished surface | 0.01 mm | dull finished surface due to scuffing | very easy |
| Comp. Ex. 2 | 32 minutes | flank wear | 0.30 mm | good finished surface having luster | difficult |
| Comp. Ex. 3 | 12 minutes | deterioration in finished surface | 0.06 mm | dull finished surface due to scuffing | not easy |
| Comp. Ex. 4 | 3 minutes | deterioration in finished surface | 0.02 mm | dull finished surface due to scuffing | not easy |
| Comp. Ex. 5 | 8 minutes | deterioration in finished surface | 0.04 mm | dull finished surface due to scuffing | easy |
| Comp. Ex. 6 | 10 minutes | deterioration in finished surface | 0.05 mm | dull finished surface due to scuffing | easy |

Figure 19:
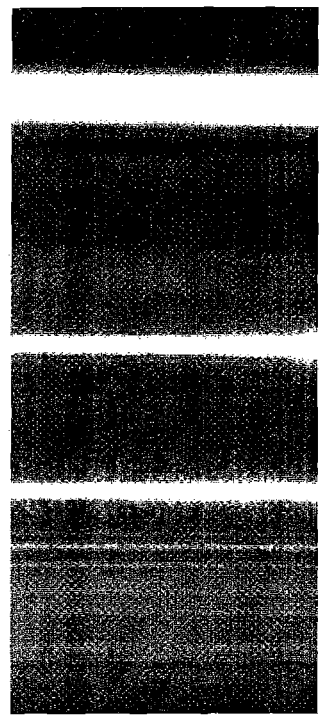
FIG. 19 shows a good finished surface having luster obtained in Example 1.

The results in Table 4 show that, with the cutting insert of Example 1 according to the present invention, until the width of flank wear reached 0.3 mm as noted above and the cutting edge reached the end of its useful life and was changed, a good finished surface having luster like that shown in FIG. 19 was obtained. That is, this insert had a long life and was able to carry out high-quality cutting. Moreover, the large amount of heat generated when the chip rubbed directly against the rake face clearly discolored the outermost layer remaining on that rake face over a wide range, making it easy to distinguish used cutting edges.

Figure 20:
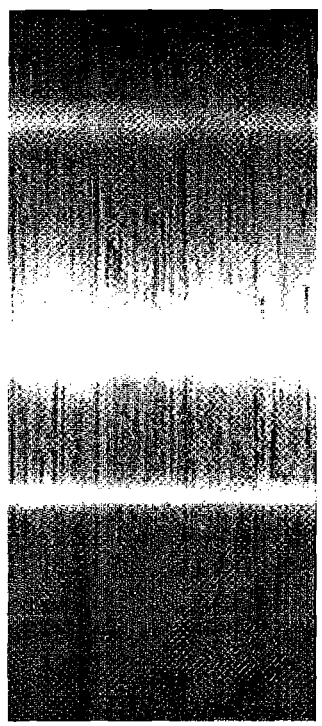
FIG. 20 shows a finished surface obtained in Comparative Example 1 that is dull due to scuffing.
Figure 21:
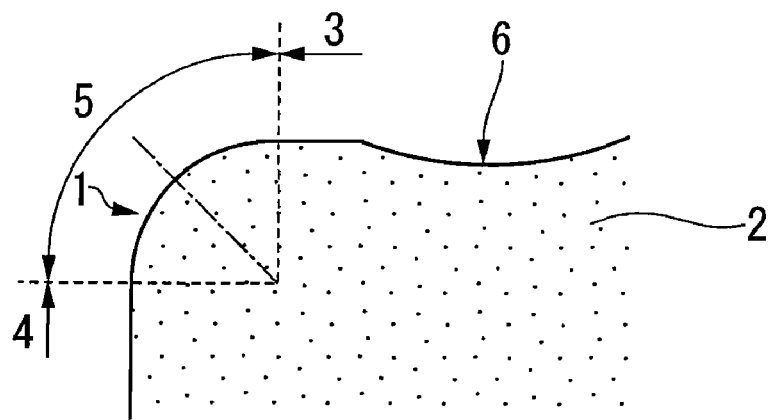
FIG. 21 is an enlarged, cross-sectional view of a conventional cutting insert, taken perpendicular to the intersecting edge line region 5 where the cutting edge 1 is formed.
Figure 22:
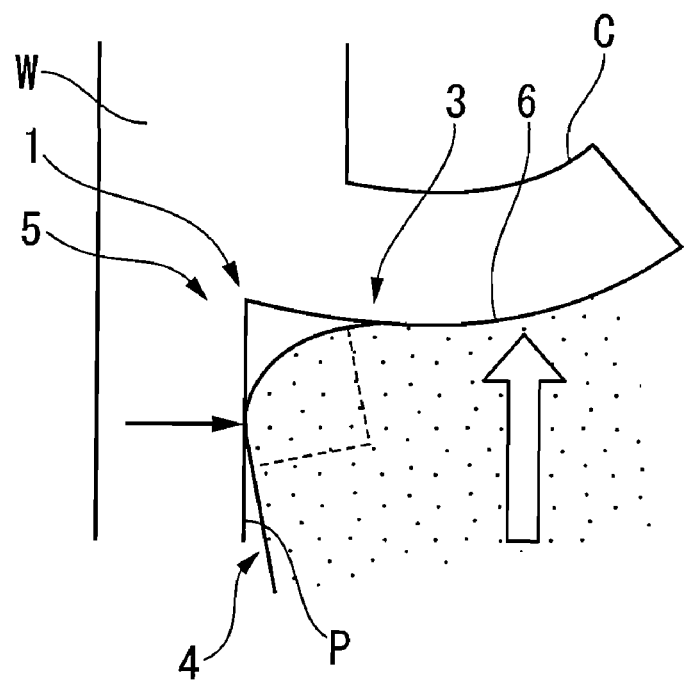
FIG. 22 illustrates a workpiece W being cut with the cutting insert shown in FIG. 21, at an early stage of cutting.

Using the cutting insert obtained in Comparative Example 2, results roughly comparable with those of Example 1 were obtained with regard to the life of the cutting edge and the condition of the finished surface on the workpiece until it is changed. However, because the outermost layer was removed from the entire surface of the rake face, the entire surface exhibited a blackish surface color, making it difficult to distinguish between used and unused cutting edges, particularly under inadequate lighting in a operational site of cutting work. Moreover, with the cutting insert in Comparative Example 1, the entire surface of which remained covered with the outermost layer, and with the cutting insert in Comparative Example 4, in which much of the outermost layer remained on the flank face and the flank face-side cutting edge portion, immediately after the start of cutting or within a short time early in cutting, although substantially no flank wear had yet arisen, the finished surface of the workpiece had a dull appearance due to scuffing like that shown in FIG. 20, making it necessary to stop cutting.

In Comparative Example 3 in which the outermost layer was removed from the rake face and the intersecting edge line region where the cutting edge is formed, although better results were obtained than in Comparative Example 1 which used an untreated surface-coated cutting insert, when the flank wear reached the flank face itself from the flank face-side cutting edge portion, the finished surface of the workpiece exhibited a dull appearance due to scuffing, at which point cutting had to be stopped. Furthermore, in these Comparative Examples 3 and 4, the outermost layer remained on the flank face, but the rake face exhibited a surface color that was the blackish color of the intermediate layer, making it difficult to distinguish without thorough observation cutting edges that had been used.

With the cutting inserts of Comparative Examples 5 and 6 which were ground with an elastic grindstone or an abrasive-containing brush, the results were substantially the same as in Comparative Example 3. However, the outermost layer was not sufficiently removed from the flank face-side cutting edge portion and, as noted above, grinding scratches arose in treated areas. Hence, even compared with Comparative Example 3, from the start of cutting, the machined surface of the workpiece exhibited a somewhat dull finished surface. Moreover, with the growth of flank wear, the finished surface worsened markedly, as a result of which cutting had to be stopped. Used cutting edges in these Comparative Examples 5 and 6 were easy to identify. Due to the effect of grinding with an elastic grindstone or a brush, the rake face exhibited luster, but had a dark yellow surface color, making used cutting edges less easy to identify than in Example 1.

Next, a CNMG120408 type insert body was similarly formed of P10 grade tungsten carbide-based cemented carbide. Waterfall-type curved honing was administered with an elastic grindstone to the intersecting edge line region, to a width of 0.05 mm measured from the rake face side and to a width of 0.03 mm measured from the flank face side. Seven types of insert body were fabricated in this way. The surfaces of four types of the insert body were coated respectively with a base layer, an intermediate layer and an outermost layer, as shown in Table 5 below. The surfaces of three types of the insert body were coated respectively with a base layer, an intermediate layer and an outermost layer, as shown in Table 6 below. Of these, the coated insert bodies in Table 5 had a bright cream color at the surface, and the coated insert bodies in Table 6 had a lustrous, yellow color.

| Base layer | Intermediate layer | Outermost layer |
|---|---|---|
| 3 μm (TiCr)C - 3 μm granular crystalline Ti(CN) | 0.2 μm TiN - 0.8 μm κ-Al$_2$O$_3$ arrangement was alternately stacked ten times | 1 μm TiN - 2 μm HfN |

TABLE 6

| Base layer | Intermediate layer | Outermost layer |
|---|---|---|
| 0.5 μm TiN - 9 μm columnar crystalline Ti(CN) - 0.5 μm Ti(CNO) | 10 μm κ-Al$_2$O$_3$ | 0.5 μm TiN - 1 μm TiC - 0.5 μm TiN |

Cutting inserts that were surface-coated in this way were held between a pair of rotating shafts so as to be rotatable around the axis of the shafts and subjected to wet blasting treatment at a jetting pressure of 0.2 MPa from a blasting gun, using an abrasive fluid prepared by mixing alumina particles having a particle size of 60 to 100 μm as the blasting abrasive with water to an abrasive content in the fluid of 20 wt %. One of these cutting inserts that had been coated under the conditions in Table 5 was wet blasted with two blasting guns from either side of the axis at a jetting angle for the abrasive fluid of 90° with respect to the axis, as shown in FIG. 4. The surface color after wet blasting, the state of outermost layer removal, and the surface roughness of the flank face are shown in Table 7 as Example 2.

Two types of cutting insert each to which the surface coatings in Tables 5 and 6 had been applied were administered wet blasting treatment while being partly or fully masked on the rhombic faces where the rake faces are formed by mounting the masking members made of hard urethane rubber shown as E to H in Table 8 on the front ends of both rotating shafts. As shown in FIG. 7, the abrasive fluid was jetted from both sides of the pair of rhombic faces on the insert body at acute angles of 45° with respect to the axis of the rotating shafts. The surface states of these respective cutting inserts are shown as Examples 3 to 6 in Table 7. The abrasive fluid and the jetting pressure were the same as in Example 2. Table 7 also shows, as Comparative Examples 7 and 8, the surface states for cutting inserts that were not subjected to wet blasting treatment.

TABLE 7

| | Coating | Shape of masking member | Surface color | | State of outermost layer removal from wet blasting | Surface roughness of flank face |
|---|---|---|---|---|---|---|
| | | | Masked area | Unmasked area | | |
| EX 2 | Table 5 | no masking | bright cream color at rake face | blackish color at flank face | Removed from flank face-side cutting edge portion and flank faces | 0.18 μm |
| EX 3 | Table 5 | E | bright cream color | blackish color | Removed from cutting edges and flank faces | 0.20 μm |
| EX 4 | Table 5 | F | bright cream color | blackish color | Removed from cutting edges, flank faces and to width of 0.3 mm from outer periphery of rake face | 0.19 μm |
| EX 5 | Table 6 | G | lustrous yellow | blackish color | Removed from cutting edges, flank faces and to width of 1.0 mm from outer periphery of rake face | 0.16 μm |
| EX 6 | Table 6 | H | lustrous yellow | blackish color | Removed from cutting edges, flank faces and to width of 1.5 mm from outer periphery of rake face | 0.17 μm |
| CE 7 | Table 5 | not wet blasted | entire surface was a bright cream color | | Outermost layer remained over entire surface of cutting edges, flank face and rake face | 0.42 μm |
| CE 8 | Table 6 | not wet blasted | entire surface was lustrous yellow | | Outermost layer remained over entire surface of cutting edges, | 0.36 μm |

TABLE 7-continued

| Coating | Shape of masking member | Surface color | | State of outermost layer removal from wet blasting | Surface roughness of flank face |
|---|---|---|---|---|---|
| | | Masked area | Unmasked area | | |
| | | | | flank face and rake face | |

TABLE 8

Shape of masking members

| | |
|---|---|
| E | Approx. 80° rhombic masking members of same shape as outer peripheral shape of rake face. |
| F | Approx. 80° rhombic masking members 0.3 mm smaller on one side than outer peripheral shape of rake face. |
| G | Approx. 80° rhombic masking members 1.0 mm smaller on one side than outer peripheral shape of rake face. |
| H | Approx. 80° rhombic masking members 1.5 mm smaller on one side than outer peripheral shape of rake face. |

The cutting inserts obtained in Examples 2 to 6 and Comparative Examples 7 and 8 were used to carry out machining by turning workpieces under the same cutting conditions. The actual cutting time until the cutting edge was changed at this time, the reason for changing the cutting edge, the width of flank wear when the cutting edge was changed, the condition of the machined surface (finished surface) on the workpiece, and the ease of distinguishing whether a cutting edge is used or unused were evaluated. Those results are shown in Table 9 below. Cutting was carried out with coolant under the following conditions: the work material was stainless steel (JIS SUS316L), the cutting speed was 200 m/min, the feed rate was 0.15 mm/rev, and the depth of cut was 1.5 mm. Evaluation was based on the same criteria as the results in Table 4.

The results in Table 9 show that, with all the cutting inserts in Examples 2 to 6 according to the present invention, the machined surfaces had a good finished surface having luster, and the cutting times were greatly extended compared with the cutting inserts in Comparative Examples 7 and 8. However, in Examples 2 to 4, slight smearing of the workpiece material was found to have occurred on the rake face region within about 0.5 mm from the boundary of the intersecting edge line region and the rake face and also, particularly in Example 2, on the rake face-side cutting edge portion. Because of the possibility that this would grow, leading to chipping at the cutting edge, cutting was stopped at the cutting time indicated in the table. By contrast, in Examples 5 and 6, because no such smearing occurred, cutting was stopped when the width of the flank wear reached 0.3 mm. The region over which smearing arises differs in this way according to the type of workpiece material and the cutting conditions. It thus appears desirable, in accordance with the conditions in each particular case, to remove the outermost layer over all of the intersecting edge line portion and also over a range in the distance from the above-described boundary of up to 2.0 mm.

Next, the base layer, intermediate layer, and outermost layer shown in Table 10 below were applied by chemical vapor deposition to the surface of an insert body made of P20 grade tungsten carbide-base cemented carbide. Next, as in

TABLE 9

| | Actual cutting time until cutting edge was changed | Reason for changing cutting edge | Width of flank wear when cutting edge was changed | Condition of machined surface (finished surface) when cutting edge was changed | Ease of distinguishing cutting edge after use in cutting |
|---|---|---|---|---|---|
| Example 2 | 15 minutes | smearing on rake face | 0.18 mm | good finished surface having luster | very easy |
| Example 3 | 17 minutes | smearing on rake face | 0.20 mm | good finished surface having luster | very easy |
| Example 4 | 20 minutes | smearing on rake face | 0.24 mm | good finished surface having luster | very easy |
| Example 5 | 25 minutes | flank wear | 0.30 mm | good finished surface having luster | very easy |
| Example 6 | 23 minutes | flank wear | 0.30 mm | good finished surface having luster | very easy |
| Comp. Ex. 7 | immediately after start of cutting | poor finished surface | 0.01 mm | dull finished surface due to scuffing | very easy |
| Comp. Ex. 8 | immediately after start of cutting | poor finished surface | 0.01 mm | dull finished surface due to scuffing | very easy | above Examples 3 to 6, wet blasting was subsequently administered under the same conditions using masking members, thereby fabricating surface-coated cutting inserts of the same shape, dimensions and outermost layer removal state as shown in FIGS. 9(b) to 13(b). When machining that took into account the shapes and dimensions of the respective cutting inserts was carried out, advantageous effects similar to those in above Examples 2 to 6 were confirmed.

In these cases, the intersecting edge line region was round honed to a radius of 0.06 mm with an abrasive-containing brush. The insert body prior to wet blasting treatment had a light golden surface color with a luster. Also, the masking members were adjusted to the shape and dimensions of the outermost layer to remain on the polygonal face in FIGS. 9(b) to 13(b). Here, the chipbreakers in the cutting inserts shown in FIGS. 11 to 13, all made by Mitsubishi Materials Corporation, were an MA breaker (FIG. 11), an MV breaker (FIG. 12), and a GH breaker (FIG. 13).

TABLE 10

| 1 µm TiC - 1 µm κ-$Al_2O_3$ - 3 µm Zr(CN) - 0.5 µm Ti(CNO) | 5 µm (mixture of 10% $ZrO_2$ and 90% α-$Al_2O_3$) | 1 µm TiN - 2 µm ZrN |
|---|---|---|

In addition, of these, an insert body having the same shape, dimensions and chipbreaker as that shown in FIG. 11(a) was made of P20 grade tungsten carbide-based cemented carbide. Waterfall-type curved honing was administered to a width measured from the rake face side of 0.07 mm and to a width measured from the flank face side of 0.04 mm, and then the surface of this insert body was coated with the base layer, intermediate layer and outermost layer shown in Table 11 below. This surface-coated cutting insert was then administered wet blasting treatment at a jetting angle of 90° based on the manufacturing method shown in FIG. 4, and using conditions I to L shown in Table 12 as the treatment conditions (abrasive content and jetting pressure of abrasive fluid), thereby manufacturing four types of surface-coated cutting inserts. The abrasive was composed of alumina particles having a particle size of 30 to 60 µm. These four types of cutting insert were Examples 7 to 9 and Comparative Example 9. In addition, a cutting insert that was not subjected to wet blasting treatment was prepared in Comparative Example 10. The surface states of each of these inserts are shown in Table 13. In Comparative Example 9, the manufacturing method of the present invention was used to obtain the cutting insert, but the degree of outermost layer removal at the flank face and the flank face-side cutting edge portion was about 50%, so primarily the intermediate layer was not exposed.

TABLE 11

| 0.5 µm TiN - 8 µm columnar crystalline Ti(CN) - 1 µm granular crystalline Ti(CN) - 0.5 µm Ti(CO) | 3.0 µm α-$Al_2O_3$ | 0.5 µm $Ti_2O_3$ - 0.5 µm Ti(NO) |
|---|---|---|

TABLE 12

| | Wet blasting conditions | |
|---|---|---|
| | Abrasive content | Jetting pressure |
| I | 40 wt % | 0.24 MPa |
| J | 30 wt % | 0.12 MPa |
| K | 20 wt % | 0.08 MPa |
| L | 10 wt % | 0.08 MPa |

TABLE 13

| | Treatment conditions | Surface color | | State of outermost layer removal due to treatment | Surface roughness of flank face |
|---|---|---|---|---|---|
| | | Rake face | Flank face | | |
| EX 7 | I | light yellow | blackish color | Outermost layer removed completely from flank face and flank face-side portion of cutting edge. | 0.10 µm |
| EX 8 | J | light yellow | blackish color | Outermost layer at least 90% removed from flank face and flank face-side portion of cutting edge. | 0.12 µm |
| EX 9 | K | light yellow | black-brown | Outermost layer at least 70% removed from flank face and flank face-side portion of cutting edge. | 0.15 µm |
| CE 9 | L | light yellow | dark brown | Outermost layer about 50% removed from flank face and flank face-side portion of cutting edge. | 0.20 µm |
| CE 10 | untreated | light yellow | light yellow | Outermost layer remains completely on flank face, cutting edge and rake face. | 0.30 µm |

Next, the cutting inserts obtained in Examples 7 to 9 and in Comparative Examples 9 and 10 were used to machine (turn) workpieces. The results were evaluated based on the same criteria as in Table 4, and are shown in Table 14. Cutting was carried out with coolant under the following conditions: the work material was bearing steel (JIS SUJ2), the cutting speed was 300 m/min, the feed rate was 0.15 mm/rev, and the depth of cut was 1.5 mm.

TABLE 14

|  | Actual cutting time until cutting edge was changed | Reason for changing cutting edge | Width of flank wear when cutting edge was changed | Condition of machined surface (finished surface) when cutting edge was changed | Ease of distinguishing cutting edge after use in cutting |
|---|---|---|---|---|---|
| EX 7 | 22 minutes | flank wear | 0.30 mm | good finished surface having luster | very easy |
| EX 8 | 20 minutes | flank wear | 0.30 mm | good finished surface having luster | very easy |
| EX 9 | 17 minutes | flank wear | 0.30 mm | good finished surface having luster | very easy |
| CE 9 | 8 minutes | deterioration in finished surface | 0.08 mm | dull finished surface due to scuffing | very easy |
| CE 10 | immediately after start of cutting | poor finished surface | 0.01 mm | dull finished surface due to scuffing | very easy |

Of these, on the cutting inserts in Examples 8 and 9 and Comparative Example 9, the outermost layer on the flank face and the flank face-side portion of the cutting edge was abraded to a small thickness by wet blasting, but not completely removed. However, it is apparent from the results in Table 14 that if the outermost layer is removed from at least 70% of the surface area in these areas, advantageous effects similar to those obtained in the other examples of the present invention are achieved. On the other hand, if the outermost layer is only removed about 50% of the surface area as in Comparative Example 9, these advantageous effects are not achieved.

Some preferred embodiments of the present invention have been described above, although these embodiments are to be considered in all respects as illustrative and not limitative. Those skilled in the art will appreciate that various additions, omissions, substitutions and other modifications are possible without departing from the scope of the present invention as disclosed in the accompanying claims. The present invention is not limited by the above-described explanation, but is limited only by the scope of the appended claims.

What is claimed is:

1. A method for manufacturing a surface-coated cutting insert, comprising the steps of:
   forming a cutting edge at an intersecting edge line region where a rake face and a flank face intersect on an insert body having a substrate of tungsten carbide-based cemented carbide, titanium carbonitride-based cermet or ceramics;
   coating a surface of the insert body with, in order from the insert body side, a base layer, an intermediate layer and an outermost layer such that the base layer and the outermost layer are formed of carbides, nitrides, oxides, or borides of one selected from the group consisting of periodic table Group IVa metals, Group Va metals, Group VIa metals, aluminum and silicon, or complex compounds thereof, and the intermediate layer is formed of primarily $Al_2O_3$; and
   removing the outermost layer by wet blasting so as to leave primarily the intermediate layer exposed on part of the surface of the insert body, including at least the flank face and at least a flank face-side cutting edge portion of the intersecting edge line region that is connected to the flank face, but excluding at least part of the rake face inside a boundary with the intersecting edge line region,
   wherein the intermediate layer is exposed on 70% or more of the surface area at the flank face.

2. The method for manufacturing a surface-coated cutting insert according to claim 1, wherein the outermost layer is removed so as to leave primarily the intermediate layer exposed on the flank face and all of the intersecting edge line region.

3. The method for manufacturing a surface-coated cutting insert according to claim 1, wherein the outermost layer is removed so as to leave primarily the intermediate layer exposed from the flank face to a range inside the rake face from the boundary between the intersecting edge line region and the rake face.

4. The method for manufacturing a surface-coated cutting insert according to claim 3, wherein the outermost layer is removed so as to leave primarily the intermediate layer exposed within a range up to 2 mm inside the rake face from the boundary between the intersecting edge line region and the rake face.

5. The method for manufacturing a surface-coated cutting insert according to claim 1, wherein the intermediate layer primarily left exposed on the flank face is made to have a surface roughness, expressed as the arithmetical mean roughness Ra at a cutoff value of 0.08 mm, of 0.3 μm or less.

6. The method for manufacturing a surface-coated cutting insert according to claim 1, wherein the intermediate layer is made to be a layer which includes $Al_2O_3$ at a content of 80 vol % or more.

7. The method for manufacturing a surface-coated cutting insert according to claim 1, wherein the method further comprises clamping and holding the insert body, between a side thereof on which the rake face is formed and an opposite side thereto, with a pair of rotating shafts that are rotatable around an axis, and carrying out wet blasting by jetting an abrasive fluid against the surface of the insert body with a blasting gun while rotating the insert body.

8. The method for manufacturing a surface-coated cutting insert according to claim 7, wherein the method further comprises carrying out wet blasting by jetting an abrasive fluid against the surface of the insert body with a blasting gun at a jetting angle of 10 to 90° to the axis of the rotating shafts.

9. The method for manufacturing a surface-coated cutting insert according to claim 8, wherein the method further comprises carrying out wet blasting by jetting an abrasive fluid against the surface of the insert body with a blasting gun at a jetting angle of 30 to 90° to the axis of the rotating shafts.

10. The method for manufacturing a surface-coated cutting insert according to claim 7, wherein the method further comprises attaching masking members to at least one of the pair of rotating shafts which clamp therebetween the insert body, and carrying out wet blasting while masking the part of the rake face.

* * * * *